United States Patent
Lin et al.

(10) Patent No.: US 10,211,067 B1
(45) Date of Patent: Feb. 19, 2019

(54) METHODS OF MAKING WIRING SUBSTRATE FOR STACKABLE SEMICONDUCTOR ASSEMBLY AND MAKING STACKABLE SEMICONDUCTOR ASSEMBLY

(71) Applicant: BRIDGE SEMICONDUCTOR CORP., Taipei (TW)

(72) Inventors: Charles W. C. Lin, Taipei (TW); Chia-Chung Wang, Hsinchu County (TW)

(73) Assignee: BRIDGE SEMICONDUCTOR CORP., Taipei (TW)

( * ) Notice: Subject to any disclaimer, the term of this patent is extended or adjusted under 35 U.S.C. 154(b) by 0 days.

(21) Appl. No.: 15/872,371

(22) Filed: Jan. 16, 2018

(51) Int. Cl.
| | |
|---|---|
| *H01L 21/00* | (2006.01) |
| *H01L 21/48* | (2006.01) |
| *H01L 23/00* | (2006.01) |
| *H01L 23/367* | (2006.01) |
| *H01L 23/498* | (2006.01) |
| *H01L 23/13* | (2006.01) |
| *H01L 25/10* | (2006.01) |

(52) U.S. Cl.
CPC ........ *H01L 21/4857* (2013.01); *H01L 21/481* (2013.01); *H01L 21/486* (2013.01); *H01L 21/4853* (2013.01); *H01L 23/13* (2013.01); *H01L 23/367* (2013.01); *H01L 23/49816* (2013.01); *H01L 23/49838* (2013.01); *H01L 24/85* (2013.01); *H01L 24/32* (2013.01); *H01L 24/48* (2013.01); *H01L 24/73* (2013.01); *H01L 24/83* (2013.01); *H01L 24/92* (2013.01); *H01L 25/105* (2013.01); *H01L 2224/32225* (2013.01); *H01L 2224/48091* (2013.01); *H01L 2224/48106* (2013.01); *H01L 2224/48225* (2013.01); *H01L 2224/73215* (2013.01); *H01L 2224/92247* (2013.01); *H01L 2225/1058* (2013.01); *H01L 2225/1076* (2013.01); *H01L 2225/1094* (2013.01); *H01L 2924/1436* (2013.01); *H01L 2924/15153* (2013.01)

(58) Field of Classification Search
None
See application file for complete search history.

(56) References Cited

U.S. PATENT DOCUMENTS

| | | | |
|---|---|---|---|
| 7,894,203 B2 | 2/2011 | Kariya et al. | |
| 7,989,950 B2 | 8/2011 | Park et al. | |
| 9,059,379 B2 * | 6/2015 | Kuo | H01L 33/54 |
| 2018/0158770 A1 * | 6/2018 | Lin | H01L 23/13 |
| 2018/0261535 A1 * | 9/2018 | Lin | H01L 21/4857 |

* cited by examiner

*Primary Examiner* — Angel Roman
(74) *Attorney, Agent, or Firm* — Muncy, Geissler, Olds & Lowe, P.C.

(57) ABSTRACT

The wiring substrate includes a cavity and a plurality of metal leads disposed around the cavity. The metal leads are bonded with a resin compound and electrically connected to a buildup circuitry or a re-distribution layer under the cavity. The bottom of the cavity is covered by a dielectric layer of the buildup circuitry or the resin compound, and an aperture is formed through the dielectric layer of the buildup circuitry or the resin compound to be communicated with the cavity. As a result, a semiconductor device can be face-down disposed in the cavity and electrically connected to the buildup circuitry or the re-distribution layer by bonding wires extending through the aperture.

18 Claims, 19 Drawing Sheets

METHODS OF MAKING WIRING SUBSTRATE FOR STACKABLE SEMICONDUCTOR ASSEMBLY AND MAKING STACKABLE SEMICONDUCTOR ASSEMBLY

FIELD OF THE INVENTION

The present invention relates to methods of making a wiring substrate and making a semiconductor assembly and, more particularly, to a method of making a wiring substrate having an aperture aligned with a cavity, and a method of making a stackable semiconductor assembly using the wiring substrate.

DESCRIPTION OF RELATED ART

Market trends of multimedia devices demand for faster and slimmer designs. One of the approaches is to assemble multiple devices on a wiring substrate with stacking configuration so that the electrical performance can be improved and the form-factor can be further minimized. U.S. Pat. No. 7,894,203 discloses a wiring substrate having a cavity for such kind of purpose. The disclosed substrate is made of two separated parts bonded together by an adhesive. The electrical connection between them is through a conductive material such as solder or conductive bump. As the substrate is a stacked structure, warpage or thermal expansion coefficient (CTE) mismatches between these two parts will result in dislocation or solder cracking, making this kind of stacking structure unreliable for practical usage. Alternatively, as described in U.S. Pat. No. 7,989,950, vertical connection channel is formed by attaching a solder ball on a substrate and sealed by encapsulation and thus form a cavity. Again, solder deforming and cracking in the encapsulation, or delamination between the encapsulant and the substrate after thermal cycling may lead to abrupt device failure and I/O disconnection.

For the reasons stated above, and for other reasons stated below, developing a wiring substrate having integral metal leads as vertical connecting channels of the wiring substrate for 3D stacking of semiconductor assembly would be highly desirable.

SUMMARY OF THE INVENTION

An objective of the present invention is to provide a method of making a wiring substrate having a cavity by etching of a sacrificial metal slug at a designated location. As this sacrificial metal slug is mechanically supported and physically surrounded by a resin compound, once a selected portion of metal is removed, a cavity with well-defined size and depth can be formed and surrounded by the resin compound, thereby allowing a device to be disposed in the cavity without contributing much thickness to the final assembly.

Another objective of the present invention is to provide a method of making a wiring substrate having an aperture aligned with a cavity, and a routing circuitry disposed under the bottom of the cavity. As a result, a semiconductor device, such as DRAM (Dynamic Random Access Memory), can be face-down disposed in the cavity and wire bonded to the routing circuitry by bonding wires extending through the aperture.

Yet another objective of the present invention is to provide a method of making a wiring substrate optionally having a built-in ground/power plane by forming a metal paddle located adjacent to a bottom surface of a cavity so that the electrical characteristics of the resulting semiconductor assembly can be greatly improved.

In accordance with the foregoing and other objectives, the present invention provides a method of making a wiring substrate, comprising: providing a metal frame, a metal slug and a plurality of metal leads, wherein the metal slug is located within the metal frame, and the metal leads are integrally connected to the metal frame and each has an inner end directed inwardly away from the metal frame and directed toward the metal slug; providing a resin compound that fills in remaining spaces within the metal frame, wherein the resin compound has a bottom surface substantially coplanar with a bottom side of the metal slug; forming a buildup circuitry that is electrically connected to bottom sides of the metal leads, wherein the buildup circuitry includes a dielectric layer and a wiring layer, the dielectric layer covers the bottom surface of the resin compound and the bottom sides of the metal slug and the metal leads, and the wiring layer extends laterally on the dielectric layer and is electrically connected to the metal leads through metallized vias in the dielectric layer; removing at least one selected portion of the metal slug to form a cavity, wherein the cavity has an entrance at a top surface of the resin compound; and forming an aperture that is aligned with the cavity and extends through the dielectric layer of the buildup circuitry.

In another aspect, the present invention provides a method of making another wiring substrate, comprising: providing a metal frame, a metal slug and a plurality of metal leads, wherein the metal slug is located within the metal frame, and the metal leads are integrally connected to the metal frame and each has an inner end directed inwardly away from the metal frame and directed toward the metal slug; providing a resin compound that fills in remaining spaces within the metal frame and covers a bottom side of the metal slug; forming a re-distribution layer that extends laterally on a bottom surface of the resin compound and is electrically connected to bottom sides of the metal leads; removing at least one selected portion of the metal slug to form a cavity, wherein the cavity has an entrance at a top surface of the resin compound; and forming an aperture that is aligned with the cavity and extends through the resin compound.

Additionally, the present invention also provides a method of making a stackable semiconductor assembly, comprising: providing the aforementioned wiring substrate by the above-mentioned method, and disposing a semiconductor device in the cavity of the wiring substrate and electrically coupling the semiconductor device to the wiring substrate through bonding wires, wherein the bonding wires extend through the aperture and provide electrical connection between the wiring layer of the buildup circuitry or the re-distribution layer and the semiconductor device.

Unless specifically indicated or using the term "then" between steps, or steps necessarily occurring in a certain order, the sequence of the above-mentioned steps is not limited to that set forth above and may be changed or reordered according to desired design.

The methods of making a wiring substrate and making the related 3D stackable semiconductor assembly using the wiring substrate according to the present invention have numerous advantages. For instance, providing the metal leads around the cavity is particularly advantageous as the semiconductor device can be disposed in the cavity and the metal leads can be electrically connected to the semiconductor device through the bonding wires and the buildup circuitry/re-distribution layer and offer horizontal routing and vertical connecting channels between two opposite sides of the wiring substrate. As the semiconductor device is disposed in the cavity, no extra grinding or lapping is needed for the semiconductor device in order to achieve ultra-thin vertically stacked semiconductor assembly feature. Binding the resin compound to the metal leads can provide robust mechanical bonds between the metal leads. Depositing the re-distribution layer or the buildup circuitry under the cavity can provide electrical routing about the aperture aligned with the bottom of the cavity and allow a face-down device to be assembled in the cavity and interconnected to the metal leads via the re-distribution layer or the buildup circuitry using the bonding wires extending through the aperture.

These and other features and advantages of the present invention will be further described and more readily apparent from the detailed description of the preferred embodiments which follows.

BRIEF DESCRIPTION OF THE DRAWINGS

The following detailed description of the preferred embodiments of the present invention can best be understood when read in conjunction with the following drawings, in which.

DETAILED DESCRIPTION OF THE PREFERRED EMBODIMENTS

Hereafter, examples will be provided to illustrate the embodiments of the present invention. Advantages and effects of the invention will become more apparent from the following description of the present invention. It should be noted that these accompanying figures are simplified and illustrative. The quantity, shape and size of components shown in the figures may be modified according to practical conditions, and the arrangement of components may be more complex. Other various aspects also may be practiced or applied in the invention, and various modifications and variations can be made without departing from the spirit of the invention based on various concepts and applications.

Embodiment 1

FIGS. 1-20 are schematic views showing a method of making a wiring substrate that includes a metal frame, a plurality of metal leads, a plurality of tie bars, a resin compound and a buildup circuitry in accordance with the first embodiment of the present invention.

Figure 1:
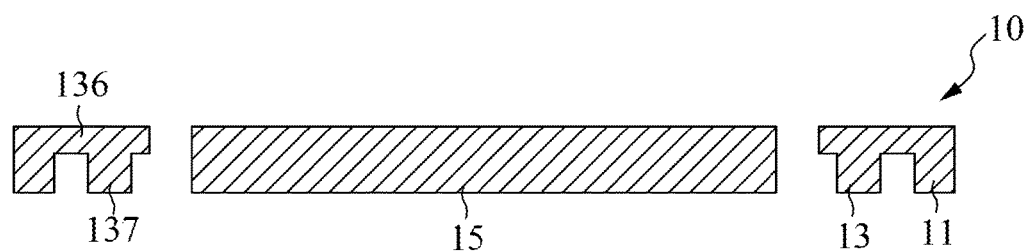
FIGS. 1, 2 and 3 are cross-sectional, top perspective and bottom perspective views, respectively, of a textured metal sheet in accordance with the first embodiment of the present invention.
Figure 2:
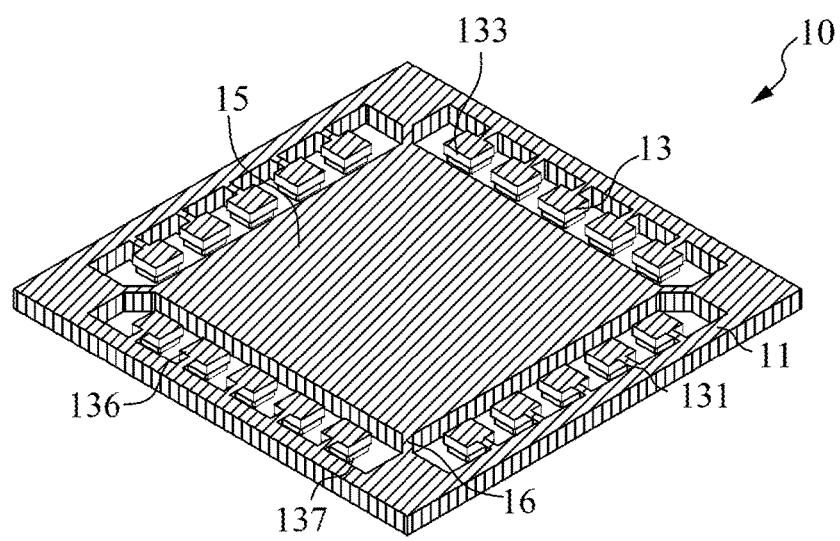
Figure 3:
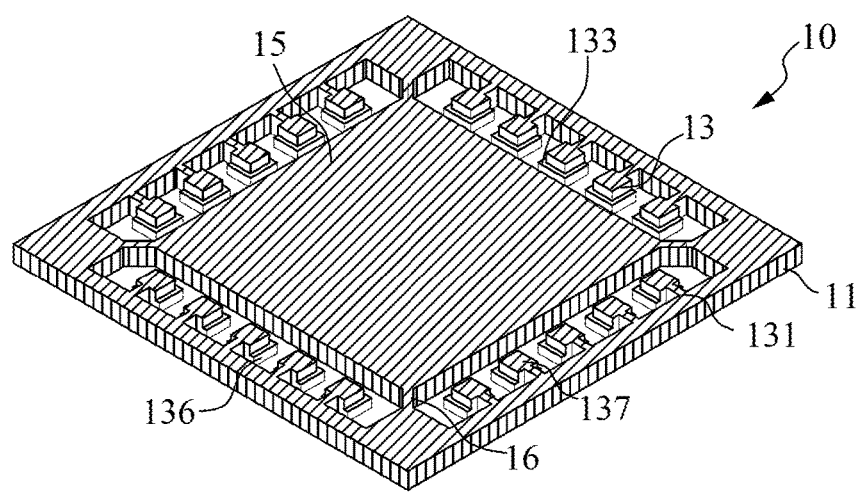

FIGS. 1, 2 and 3 are cross-sectional, top and bottom perspective views, respectively, of a textured metal sheet 10. The textured metal sheet 10 typically is made of copper alloys, steel or alloy 42, and can be formed by a wet etching or stamping/punching process from a rolled metal strip having a thickness in a range from about 0.15 mm to about 1.0 mm. The etching process may be a one-sided or two-sided etching to etch through the metal strip and thereby transfer the metal strip into a desired overall pattern of the textured metal sheet 10 that includes a metal frame 11, a plurality of metal leads 13, a metal slug 15 and a plurality of tie bars 16. The metal leads 13 laterally extend from the metal frame 11 toward the central area within the metal frame 11. As a result, the metal leads 13 each have an outer end 131 integrally connected to interior sidewalls of the metal frame 11 and an inner end 133 directed inwardly away from the metal frame 11. The metal slug 15 is located at the central area within the metal frame 11 and connected to the metal frame 11 by the tie bars 16. Additionally, in this embodiment, the textured metal sheet 10 is further selectively half-etched from its bottom side. Accordingly, the metal leads 13 have stepped peripheral edges. The metal leads 13 each have a horizontally elongated portion 136 and a vertically projected portion 137. The vertically projected portion 137 protrudes from a lower surface of the horizontally elongated portion 136 in the downward direction.

Figure 4:
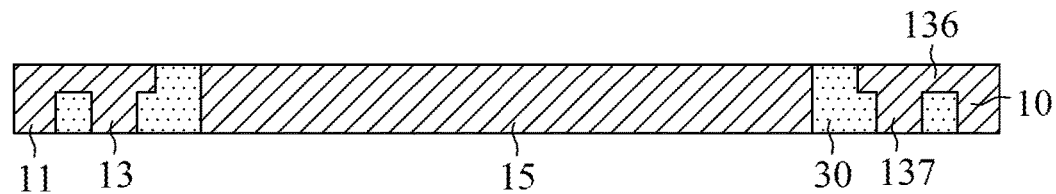
FIGS. 4, 5 and 6 are cross-sectional, top perspective and bottom perspective views, respectively, of the structure of FIGS. 1, 2 and 3 further provided with a resin compound in accordance with the first embodiment of the present invention.
Figure 5:
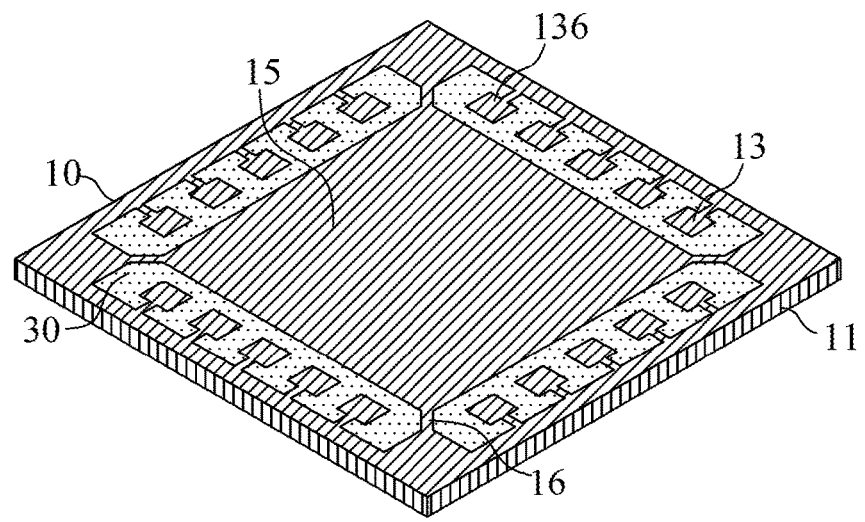
Figure 6:
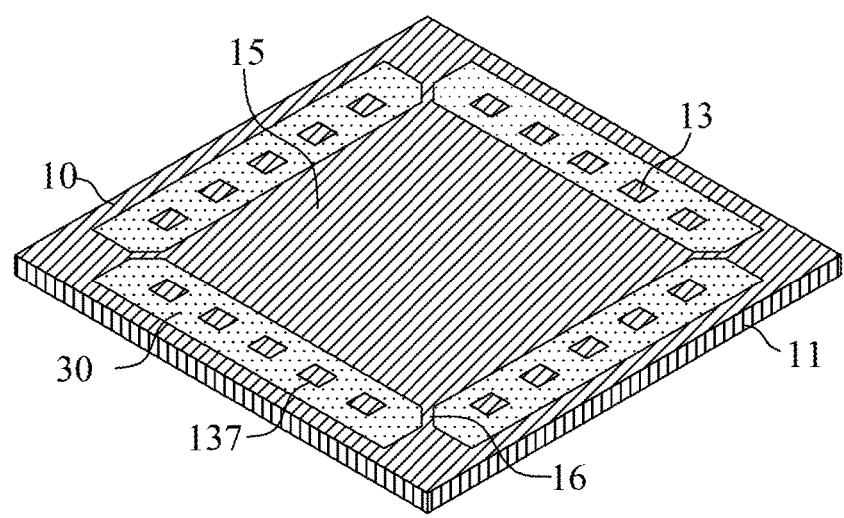

FIGS. 4, 5 and 6 are cross-sectional, top and bottom perspective views, respectively, of the structure provided with a resin compound 30. The resin compound 30 can be deposited by applying a resin material into the remaining spaces within the metal frame 11. The resin material can be applied by paste printing, compressive molding, transfer molding, liquid injection molding, spin coating, or other suitable methods. Then, a thermal process (or heat-hardened process) is applied to harden the resin material and to transform it into a solid molding compound. As a result, the resin compound 30 covers the lower surfaces of the horizontally elongated portions 136 as well as sidewalls of the vertically projected portions 137 and sidewalls of the metal slug 15. By the stepped cross-section profile of the metal leads 13, the resin compound 30 can securely interlock with the metal leads 13 so as to prevent the metal leads 13 from being vertically forced apart from the resin compound 30 and also to avoid micro-cracking at the interface along the vertical direction. In this illustration, the top surface of the resin compound 30 is substantially coplanar with the top sides of the metal leads 13 and the metal slug 15, whereas the bottom surface of the resin compound 30 is substantially coplanar with the bottom sides of the metal leads 13 and the metal slug 15 by planarization.

The resin compound 30 typically includes binder resins, fillers, hardeners, diluents, and additives. There is no particular limit to the binder resin that can be used in accordance with the present invention. For example, the binder resin may be at least one selected from the group consisting of an epoxy resin, a phenol resin, a polyimide resin, a polyurethane resin, a silicone resin, a polyester resin, an acrylate, bismaleimide (BMI), and equivalents thereof. The binder resin provides intimate adhesion between an adherent and the filler. The binder resin also serves to elicit thermal conductivity through chain-like connection of the filler. The binder resin may also improve physical and chemical stability of the molding compound.

Additionally, there is no particular limit to the filler that can be used in accordance with the present invention. For example, a thermally conductive filler may be selected from the group consisting of aluminum oxide, aluminum nitride, silicon carbide, tungsten carbide, boron carbide, silica and equivalents thereof. More specifically, the resin compound 30 may become thermally conductive or have low CTE if suitable fillers are dispersed therein. For example, aluminum nitride (AlN) or silicon carbide (SiC) has relatively high thermal conductivity, high electrical resistance, and a relatively low coefficient of thermal expansion (CTE). Accordingly, when the resin compound 30 employs these kinds of materials as fillers, the resin compound 30 would exhibit improved heat dissipation performance, electrical isolation performance and show inhibition of delamination or cracking of circuitry or interfaces due to low CTE. The maximum particle size of the thermally conductive filler may be 25 μm or less. The content of the filler may be in the range of 10 to 90% by weight. If the content of the thermally conductive filler is less than 10% by weight, this may result in insufficient thermal conductivity and excessively low viscosity. Low viscosity means that it may be difficult to handle and control the process due to excessively easy outflow of the resin from the tool during dispensing or molding process. On the other hand, if the content of the filler is higher than 90% by weight, this may result in decreased adhesive strength and excessively high viscosity of the molding material. High viscosity of the molding material results in poor workability due to no outflow of the material from the tool during the dispensing or molding process. Additionally, the resin compound 30 may include more than one type of fillers. For example, the second filler may be polytetrafluoroethylene (PTFE) so as to further improve electrical isolation property of the resin compound 30. In any case, the resin compound 30 preferably has an elastic modulus larger than 1.0 GPa and a linear coefficient of thermal expansion in a range from about $5 \times 10^{-6}$ $K^{-1}$ to about $15 \times 10^{-6}$ $K^{-1}$.

Figure 7:
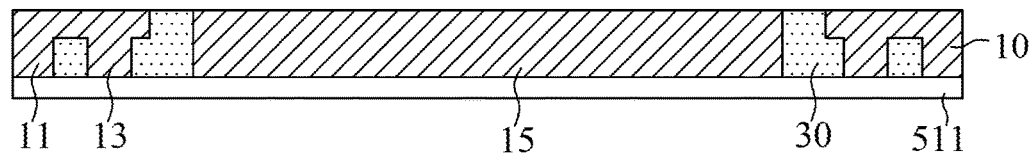
FIGS. 7, 8 and 9 are cross-sectional, top perspective and bottom perspective views, respectively, of the structure of FIGS. 4, 5 and 6 further provided with a dielectric layer in accordance with the first embodiment of the present invention.
Figure 8:
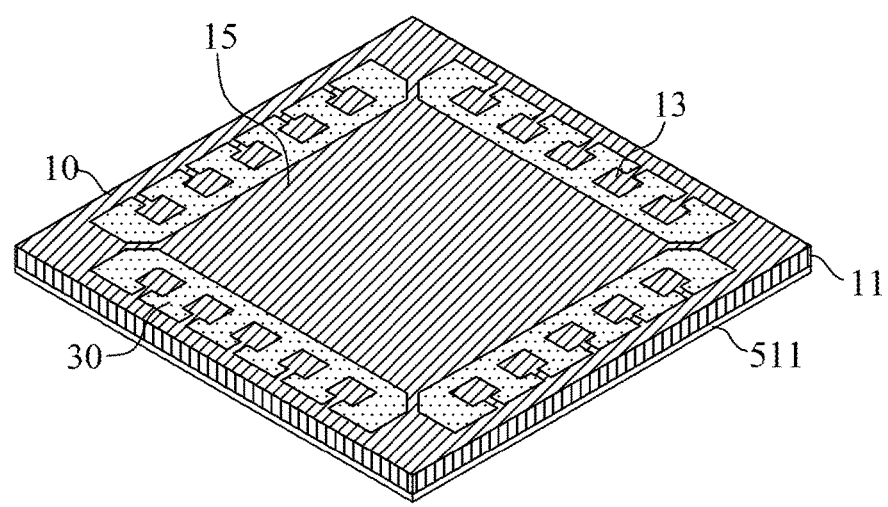
Figure 9:
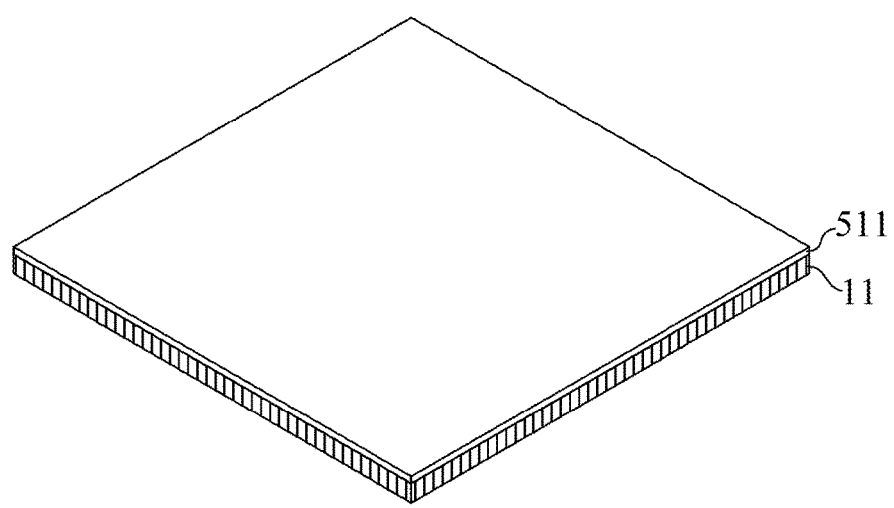

FIGS. 7, 8 and 9 are cross-sectional, top and bottom perspective views, respectively, of the structure with a dielectric layer 511 formed on the textured metal sheet 10 and the resin compound 30. The dielectric layer 511 is deposited typically by lamination or coating, and contacts and covers and extends laterally on the textured metal sheet 10 and the resin compound 30 from below. The dielectric layer 511 typically has a thickness of 50 microns, and can be made of epoxy resin, glass-epoxy, polyimide, or the like.

Figure 10:
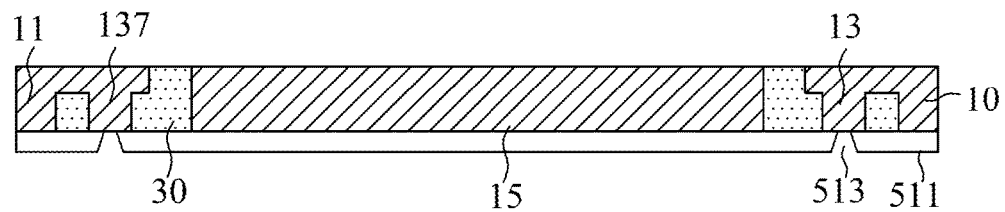
FIGS. 10, 11 and 12 are cross-sectional, top perspective and bottom perspective views, respectively, of the structure of FIGS. 7, 8 and 9 further provided with via openings in accordance with the first embodiment of the present invention.
Figure 11:
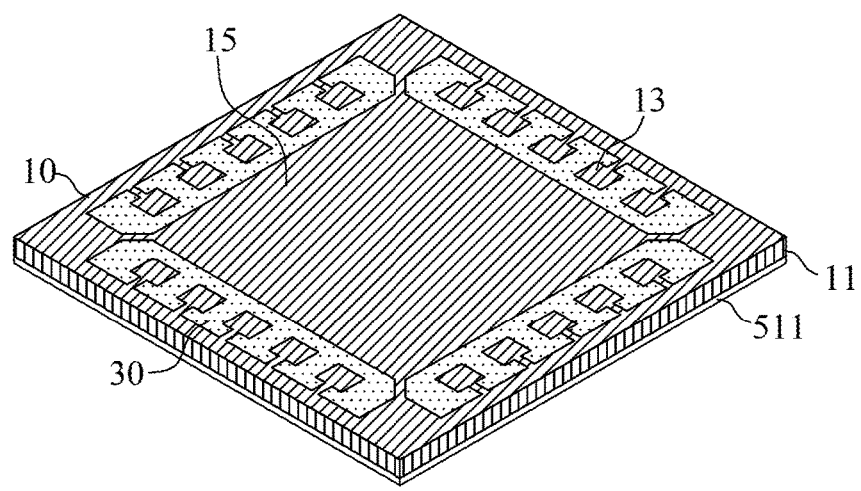
Figure 12:
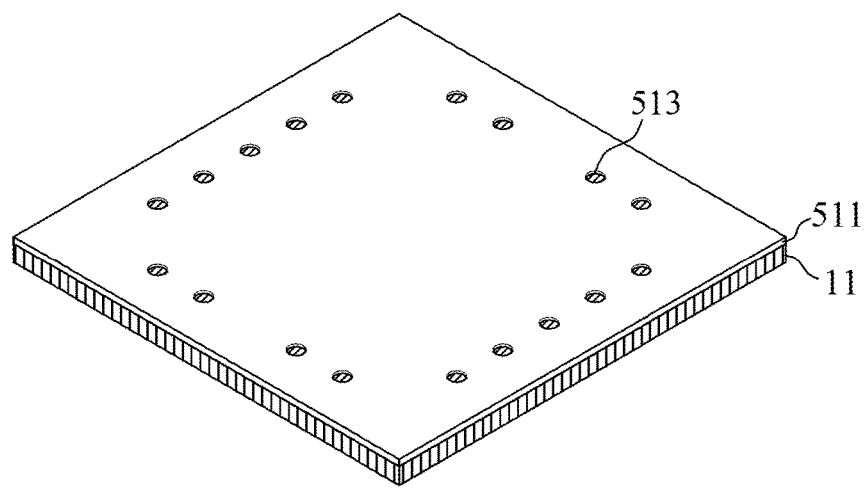

FIGS. 10, 11 and 12 are cross-sectional, top and bottom perspective views, respectively, of the structure provided with via openings 513 to expose selected portions of the metal leads 13 from below. The via openings 513 are formed by numerous techniques including laser drilling, plasma etching and photolithography, and typically have a diameter of 50 microns. Laser drilling can be enhanced by a pulsed laser. Alternatively, a scanning laser beam with a metal mask can be used. The via openings 513 extend through the dielectric layer 511, and are aligned with selected portions of the vertically projected portions 137 of the metal leads 13.

Figure 13:
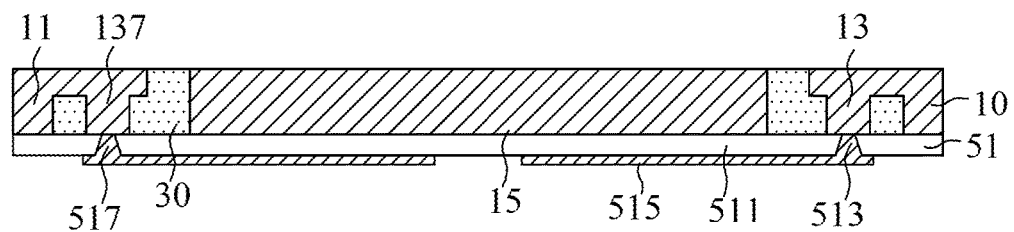
FIGS. 13, 14 and 15 are cross-sectional, top perspective and bottom perspective views, respectively, of the structure of FIGS. 10, 11 and 12 further provided with a wiring layer in accordance with the first embodiment of the present invention.
Figure 14:
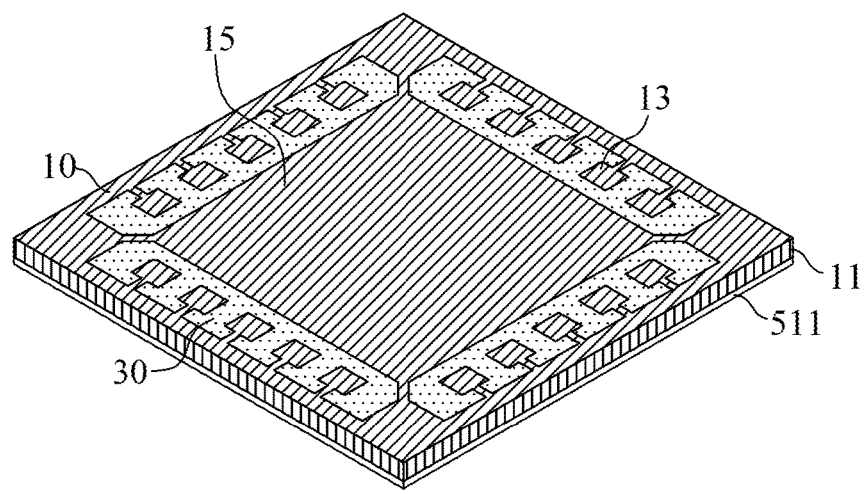
Figure 15:
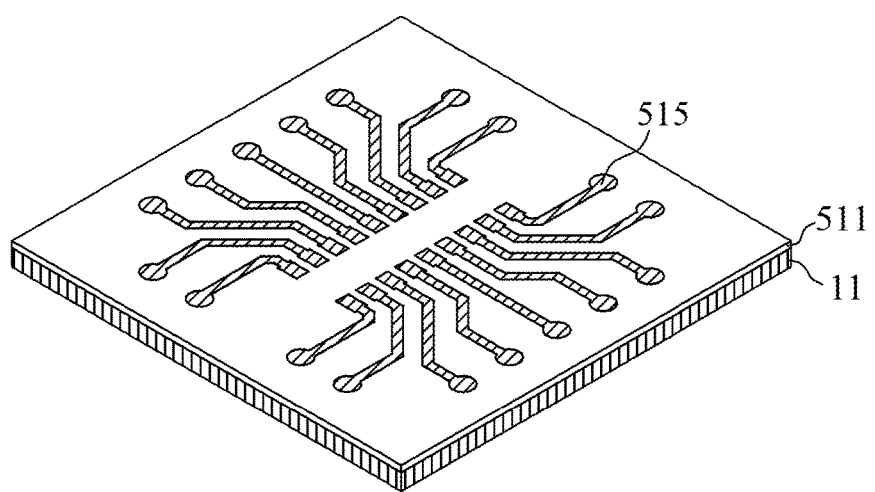

FIGS. 13, 14 and 15 are cross-sectional, top and bottom perspective views, respectively, of the structure with a wiring layer 515 formed on the dielectric layer 511 by metal deposition and metal patterning process. The wiring layer 515 typically is made of copper and extends from the metal leads 13 in the downward direction, fills up the via openings 513 to form metallized vias 517 in direct contact with the metal leads 13, and extends laterally on the dielectric layer 511. As a result, the wiring layer 515 is electrically connected to the metal leads 13 through the metallized vias 517 and provides horizontal routing in both the X and Y directions and vertical routing through the via openings 513.

At this stage, the formation of a buildup circuitry 51 is accomplished. In this illustration, the buildup circuitry 51 includes the dielectric layer 511 and the wiring layer 515.

Figure 16:
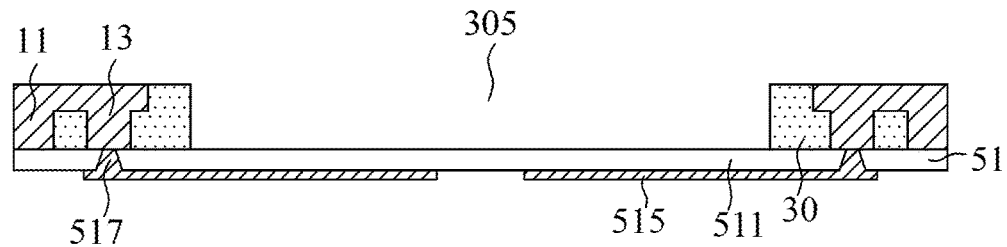
FIGS. 16 and 17 are cross-sectional and top perspective views, respectively, of the structure of FIGS. 13, 14 and 15 further formed with a cavity in accordance with the first embodiment of the present invention.
Figure 17:
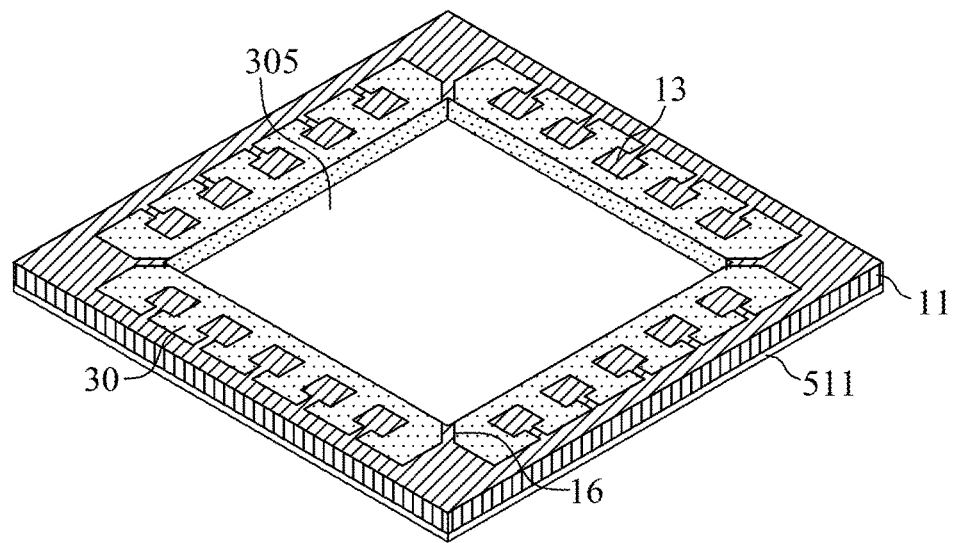

FIGS. 16 and 17 are cross-sectional and top perspective views, respectively, of the structure after removal of the metal slug 15. The metal slug 15 can be entirely removed by numerous techniques, such as wet chemical etching, electrochemical etching or laser, to form a cavity 305 that has an entrance at the top surface of the resin compound 30.

Figure 18:
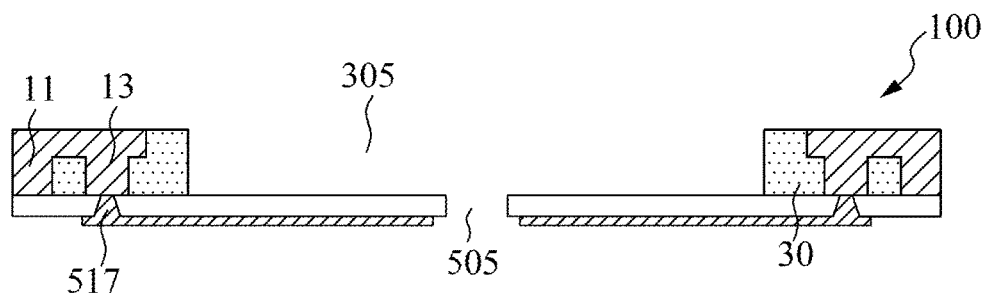
FIGS. 18, 19 and 20 are cross-sectional, top perspective and bottom perspective views, respectively, of the structure of FIGS. 16 and 17 further provided with an aperture to finish the fabrication of an untrimmed wiring substrate in accordance with the first embodiment of the present invention.
Figure 19:
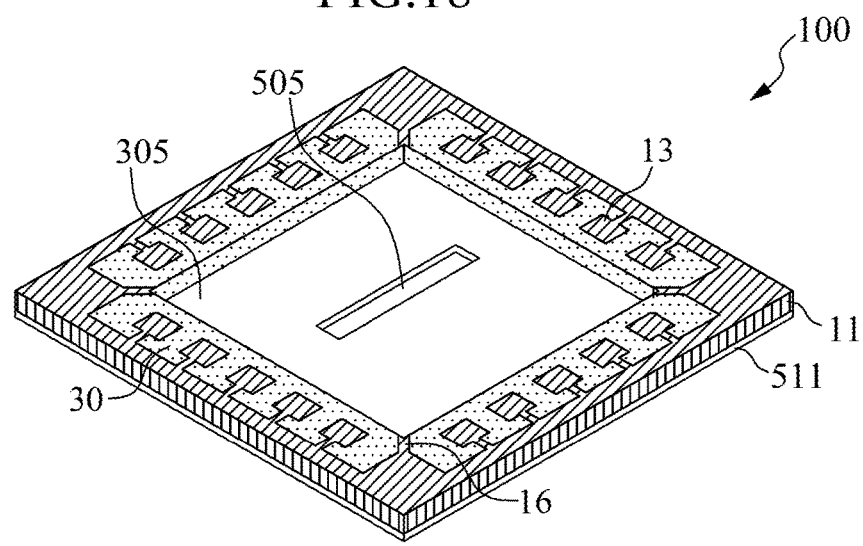
Figure 20:
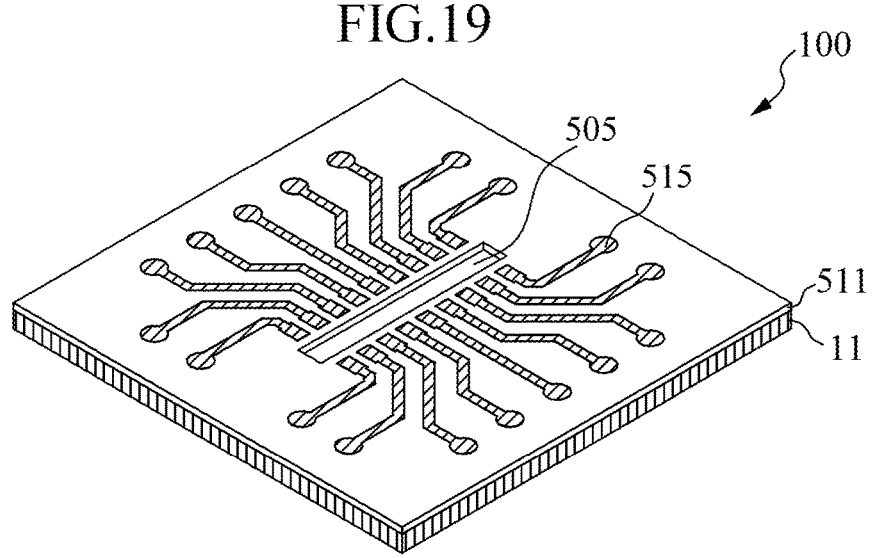

FIGS. 18, 19 and 20 are cross-sectional, top and bottom perspective views, respectively, of the structure provided with an aperture 505. The aperture 505 extends through the dielectric layer 511 in the vertical directions and is aligned with the central area of the cavity 305. The aperture 505 is formed by mechanical drilling and can be formed by other techniques such as laser drilling and plasma etching.

At this stage, an untrimmed wiring substrate 100 is accomplished and includes the metal frame 11, the metal leads 13, the tie bars 16, the resin compound 30 and the buildup circuitry 51.

Figure 21:
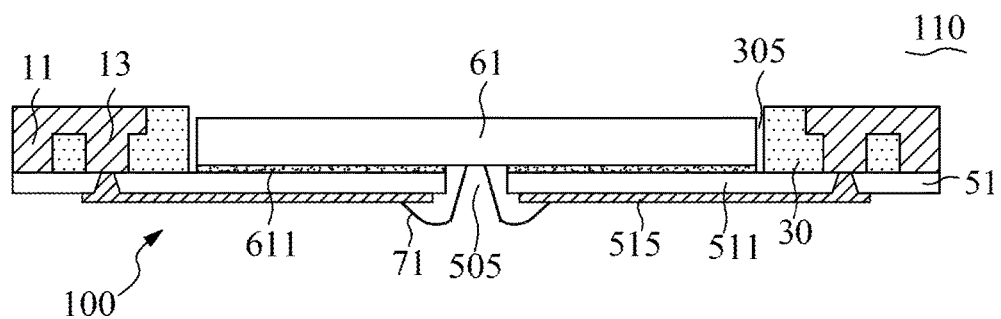
FIGS. 21, 22 and 23 are cross-sectional, top perspective and bottom perspective views, respectively, of a semiconductor assembly having a semiconductor device electrically connected to the wiring substrate of FIGS. 18, 19 and 20 in accordance with the first embodiment of the present invention.
Figure 22:
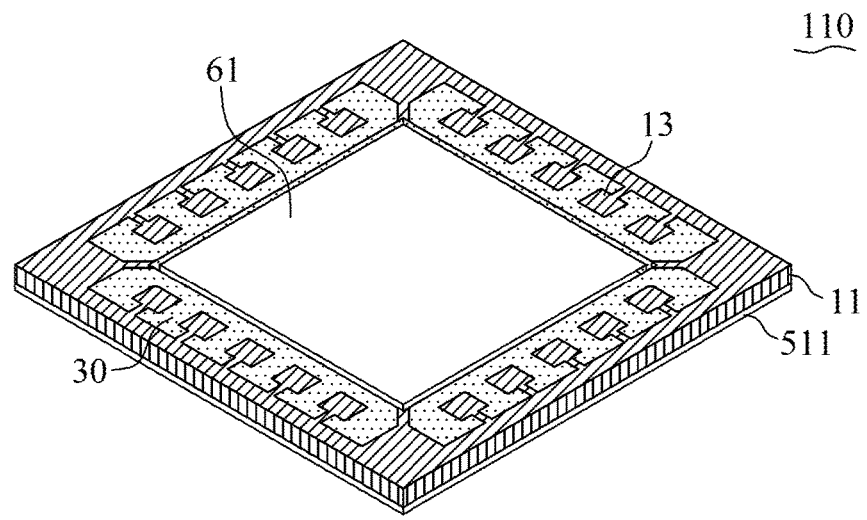
Figure 23:
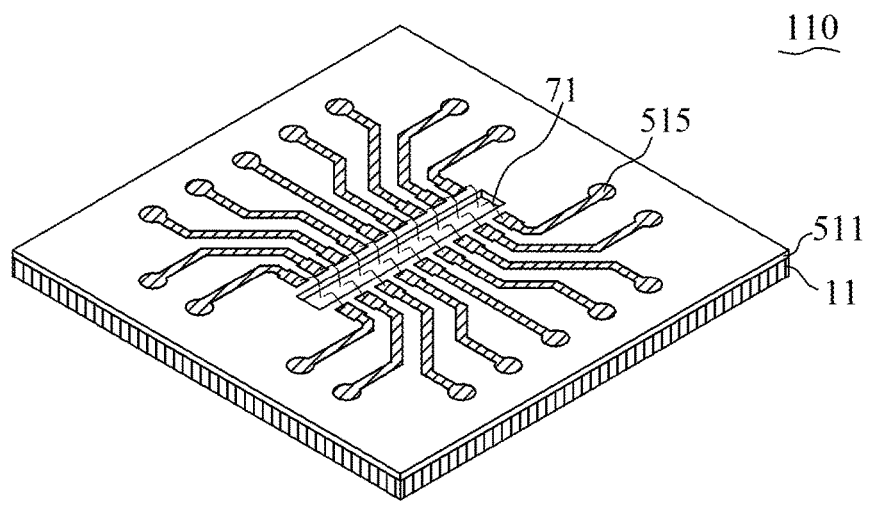

FIGS. 21, 22 and 23 are cross-sectional, top and bottom perspective views, respectively, of a semiconductor assembly 110 with a semiconductor device 61 electrically coupled to the wiring substrate 100. The semiconductor device 61, illustrated as a DRAM chip, is face-down disposed in the cavity 305 and attached on the dielectric layer 511 through an adhesive 611 and electrically coupled to the wiring layer 515 through bonding wires 71. The bonding wires 71 extend through the aperture 505 and electrically connect the semiconductor device 61 to the buildup circuitry 51 typically by gold or copper ball bonding, or gold or aluminum wedge bonding.

Figure 24:
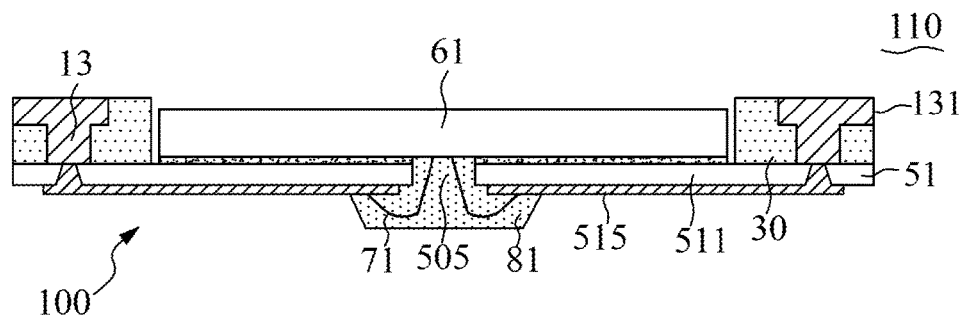
FIGS. 24 and 25 are cross-sectional and bottom perspective views, respectively, of the structure of FIGS. 21, 22 and 23 further provided with a molding compound and subjected to a trimming process in accordance with the first embodiment of the present invention.
Figure 25:
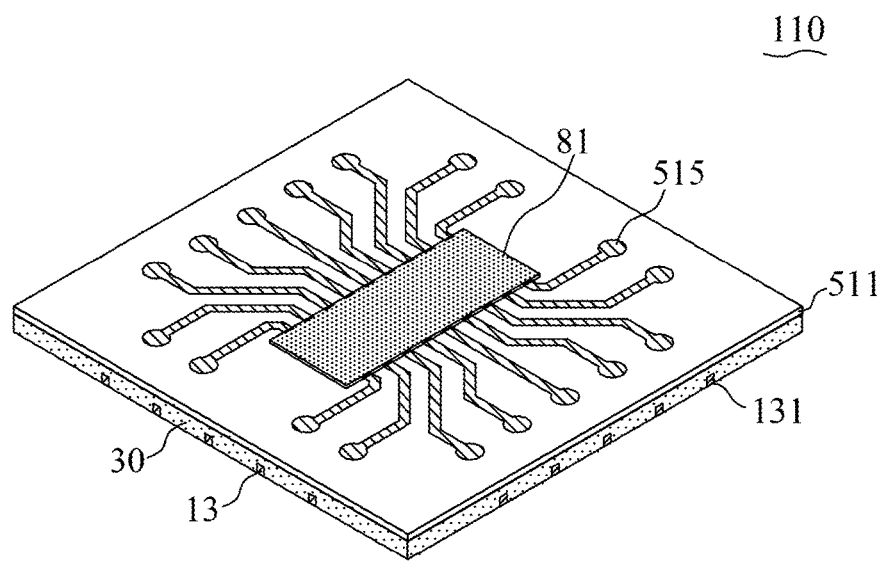

FIGS. 24 and 25 are cross-sectional and bottom perspective views, respectively, of the semiconductor assembly 110 after removal of the metal frame 11 and provided with a molding compound 81. Optionally, the molding compound 81 may be further provided to cover and encapsulate the bonding wires 71 from below, and further extends into the aperture 505. Removal of the metal frame 11 can be done by various methods including chemical etching, mechanical trimming/cutting or sawing to separate the metal frame 11 from the outer ends 131 of the metal leads 13. As a result, the outer ends 131 of the metal leads 13 are situated at peripheral edges of the trimmed wiring substrate 100 and have a lateral surface flush with peripheral edges of the resin compound 30.

Figure 26:
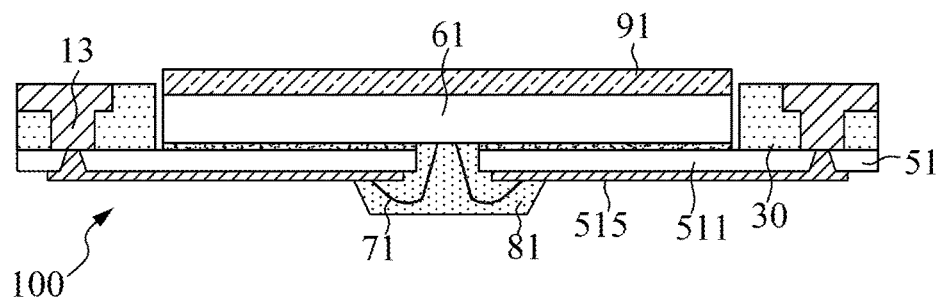
FIG. 26 is a cross-sectional view of the structure of FIG. 24 further provided with a heat spreader in accordance with the first embodiment of the present invention.

FIG. 26 is a cross-sectional view of the semiconductor assembly 110 further provided with a heat spreader 91 on the top surface of the semiconductor device 61. The heat spreader 91 is attached to the top surface of the semiconductor device 61 and typically is made of a thermally conductive material, such as metal, alloy, silicon, ceramic or graphite.

Figure 27:
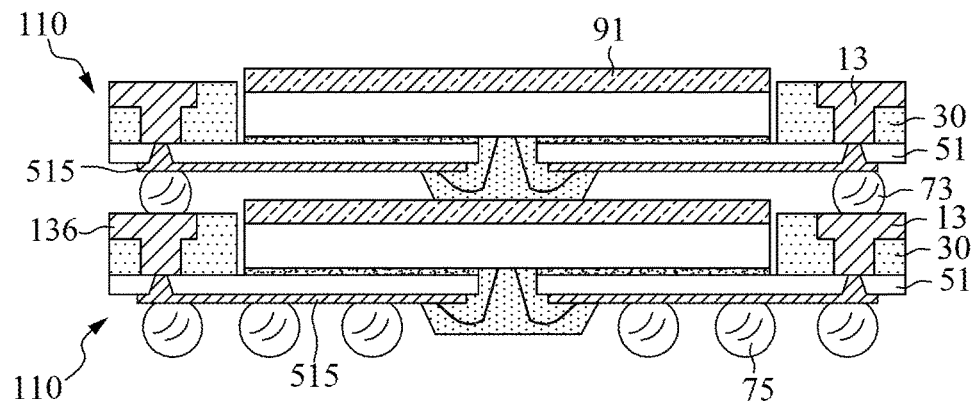
FIG. 27 is a cross-sectional view of a three-dimensional stacked semiconductor package having two semiconductor assemblies of FIG. 26 in accordance with the first embodiment of the present invention.

FIG. 27 is a cross-sectional view of a three-dimensional stacked semiconductor package having two semiconductor assemblies 110 of FIG. 26 electrically connected to each other by solder balls 73. The upper semiconductor assembly 110 is stacked on and electrically coupled to the lower semiconductor assembly 110 by solder balls 73 in contact with the wiring layer 515 of the buildup circuitry 51 of the upper semiconductor assembly 110 and the horizontally elongated portions 136 of the metal leads 13 of the lower semiconductor assembly 110. Further, additional solder balls 75 are mounted on the wiring layer 515 of the buildup circuitry 51 of the lower semiconductor assembly 110.

Figure 28:
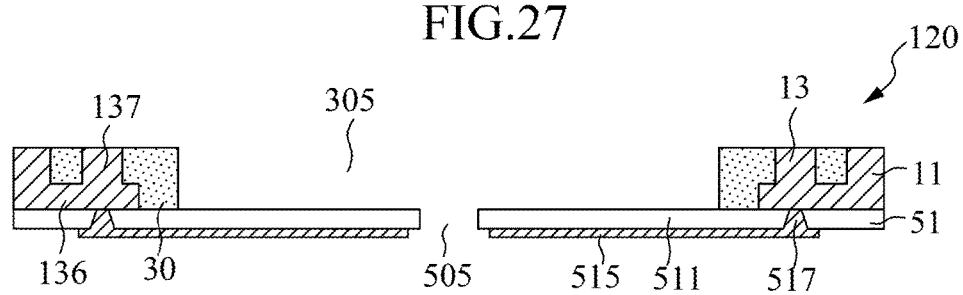
FIGS. 28 and 29 are cross-sectional and top perspective views, respectively, of another aspect of the untrimmed wiring substrate in accordance with the first embodiment of the present invention.
Figure 29:
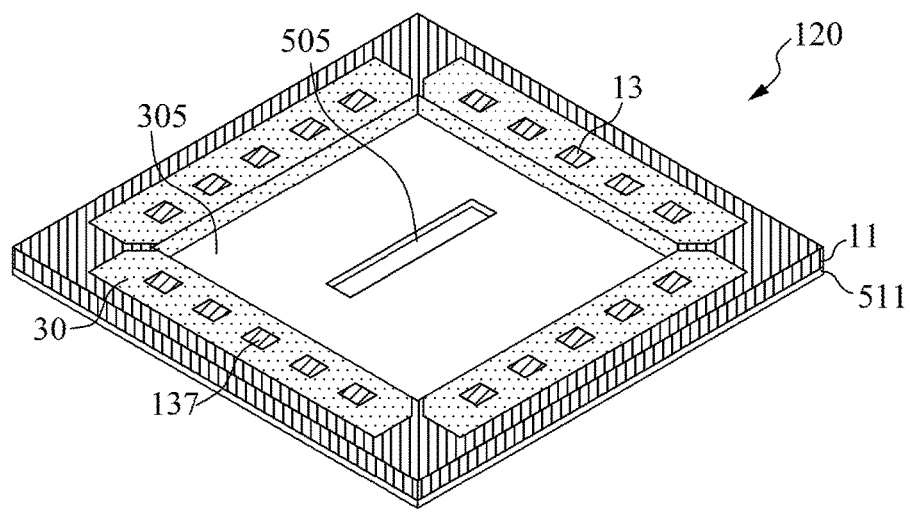

FIGS. 28 and 29 are cross-sectional and top perspective views, respectively, of another aspect of the untrimmed wiring substrate according to the first embodiment of the present invention. The untrimmed wiring substrate 120 is similar to that illustrated in FIG. 18, except that the stepped peripheral edges of the metal leads 13 are formed by selectively half-etching from the top side of the textured metal sheet 10. In this aspect, the vertically projected portion 137 protrudes from an upper surface of the horizontally elongated portion 136 in the upward direction, and the wiring layer 515 of the buildup circuitry 51 is electrically connected to the horizontally elongated portions 136 of the metal leads 13.

Figure 30:
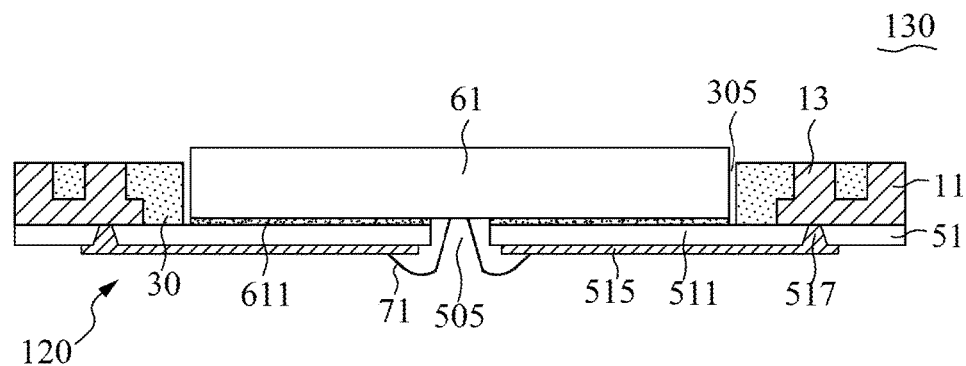
FIG. 30 is a cross-sectional view of a semiconductor assembly having a semiconductor device electrically connected to the wiring substrate of FIGS. 28 and 29 in accordance with the first embodiment of the present invention.

FIG. 30 is a cross-sectional view of the structure with a semiconductor device 61 electrically coupled to the wiring substrate 120. The semiconductor device 61 is face-down disposed in the cavity 305 and attached on the dielectric layer 511 through an adhesive 611 and electrically coupled to the wiring layer 515 of the buildup circuitry 51 through bonding wires 71. In this illustration, the semiconductor device 61 extends beyond the top surface of the resin compound 30 in the upward direction.

Figure 31:
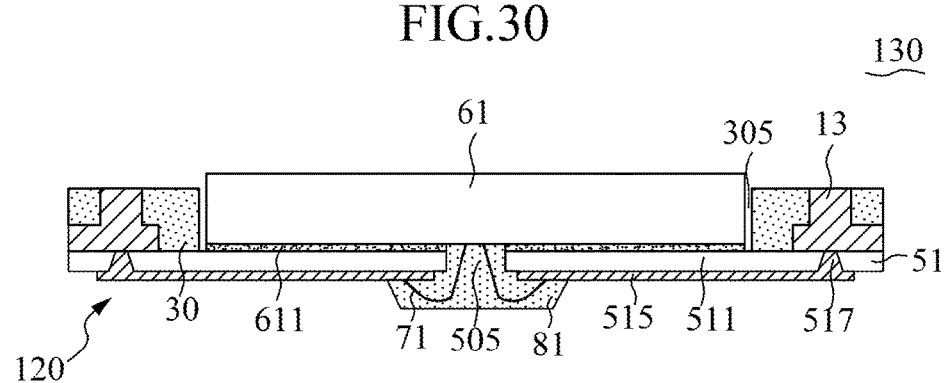
FIG. 31 is a cross-sectional view of the structure of FIG. 30 further provided with a molding compound and subjected to a trimming process in accordance with the first embodiment of the present invention.

FIG. 31 is a cross-sectional view of a semiconductor assembly 130 after removal of the metal frame 11 and provided with a molding compound 81. Optionally, the molding compound 81 may be further provided to cover and encapsulate the bonding wires 71 from below, and further extends into the aperture 505. By separating the metal frame 11, the connection between the metal leads 13 is broken.

Figure 32:
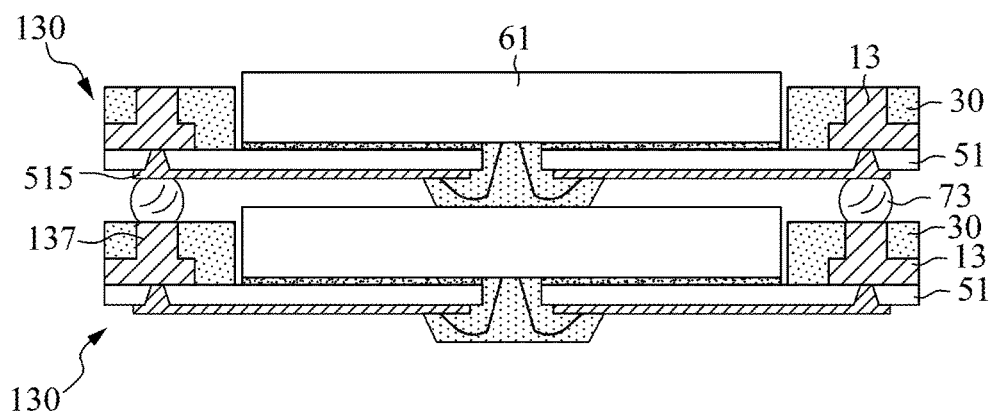
FIG. 32 is a cross-sectional view of a three-dimensional stacked semiconductor package having two semiconductor assemblies of FIG. 31 in accordance with the first embodiment of the present invention.

FIG. 32 is a cross-sectional view of a three-dimensional stacked semiconductor package having two semiconductor assemblies 130 of FIG. 31 electrically connected to each other by solder balls 73. The upper semiconductor assembly 130 is stacked on and electrically coupled to the lower semiconductor assembly 130 by the solder balls 73.

Figure 33:
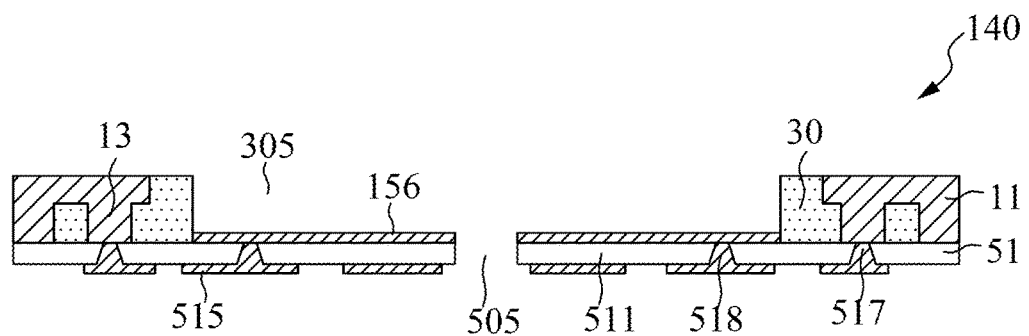
FIGS. 33 and 34 are cross-sectional and top perspective views, respectively, of yet another aspect of the untrimmed wiring substrate in accordance with the first embodiment of the present invention.
Figure 34:
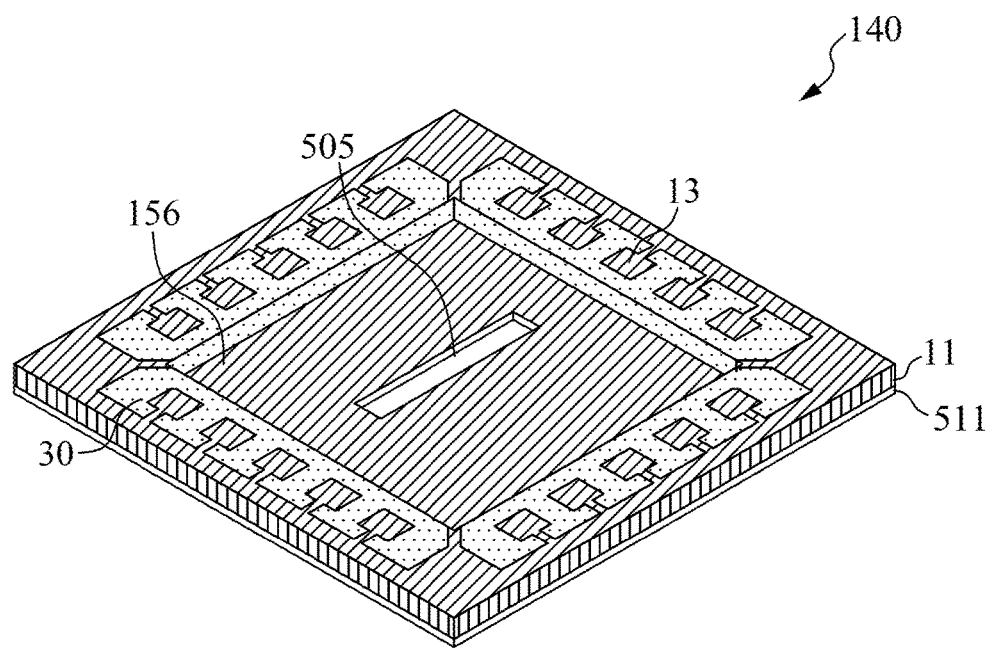

FIGS. 33 and 34 are cross-sectional and top perspective views, respectively, of yet another aspect of the untrimmed wiring substrate according to the first embodiment of the present invention. The untrimmed wiring substrate 140 is similar to that illustrated in FIG. 18, except that (i) it further includes a remaining portion of the metal slug 15 as a metal paddle 156 by selective removal of the metal slug 15 so that the cavity 305 is formed by the top surface of the metal paddle 156 and the interior sidewall surface of the resin compound 30, (ii) the aperture 505 further extends through the metal paddle 156, and (iii) the wiring layer 515 further includes additional metallized vias 518 in contact with the metal paddle 156. As a result, the metal paddle 156 is located at the bottom of the cavity 305 and thermally conductible to the buildup circuitry 51 through the metallized vias 518 as heat pipes. The metal paddle 156 can also serve as a ground/power plane and be electrically connected to the metal leads 13 through bottom buildup circuitry 51.

Figure 35:
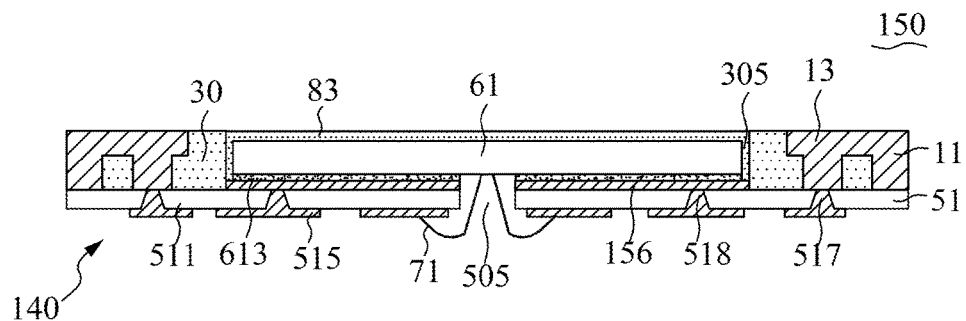
FIG. 35 is a cross-sectional view of a semiconductor assembly having a semiconductor device electrically connected to the wiring substrate of FIGS. 33 and 34 in accordance with the first embodiment of the present invention.

FIG. 35 is a cross-sectional view of a semiconductor assembly 150 with a semiconductor device 61 electrically coupled to the wiring substrate 140. The semiconductor device 61 is face-down disposed in the cavity 305 and attached on the metal paddle 156 through a thermally conductive material 613 and electrically coupled to the wiring layer 515 of the buildup circuitry 51 through bonding wires 71. As a result, the semiconductor device 61 can be thermally conductible to the metal paddle 156 and electrically coupled to the metal leads 13 through the buildup circuitry 51. Optionally, an encapsulant 83 may be further provided to fill up the remaining space within the cavity 305 and cover the semiconductor device 61 from above.

Figure 36:
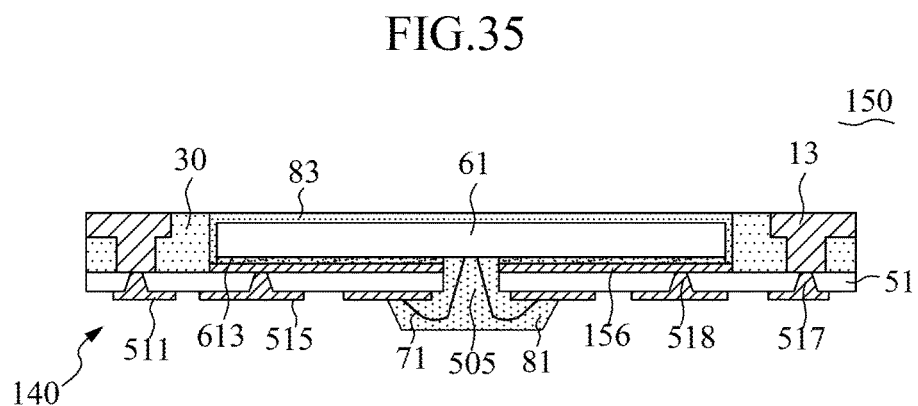
FIG. 36 is a cross-sectional view of the structure of FIG. 35 further provided with a molding compound and subjected to a trimming process in accordance with the first embodiment of the present invention.

FIG. 36 is a cross-sectional view of the semiconductor assembly 150 after removal of the metal frame 11 and provided with a molding compound 81. Optionally, the molding compound 81 may be further provided to cover and encapsulate the bonding wires 71 from below, and further extends into the aperture 505. By separating the metal frame 11, the connection between the metal leads 13 is broken.

Figure 37:
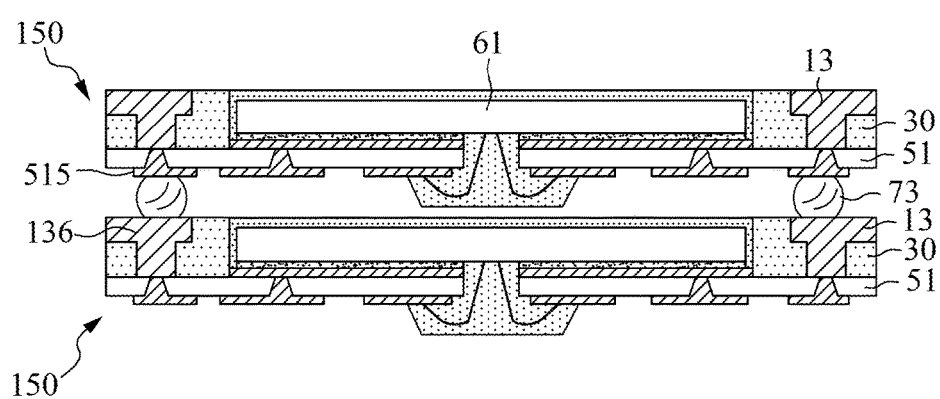
FIG. 37 is a cross-sectional view of a three-dimensional stacked semiconductor package having two semiconductor assemblies of FIG. 36 in accordance with the first embodiment of the present invention.

FIG. 37 is a cross-sectional view of a three-dimensional stacked semiconductor package having two semiconductor assemblies 150 of FIG. 36 electrically connected to each other by solder balls 73. The upper semiconductor assembly 150 is stacked on and electrically coupled to the lower semiconductor assembly 150 by the solder balls 73.

Figure 38:
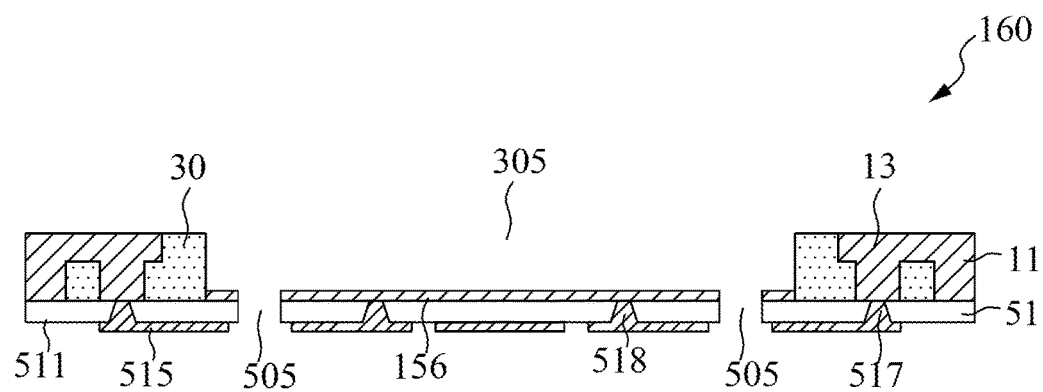
FIGS. 38 and 39 are cross-sectional and top perspective views, respectively, of yet another aspect of the untrimmed wiring substrate in accordance with the first embodiment of the present invention.
Figure 39:
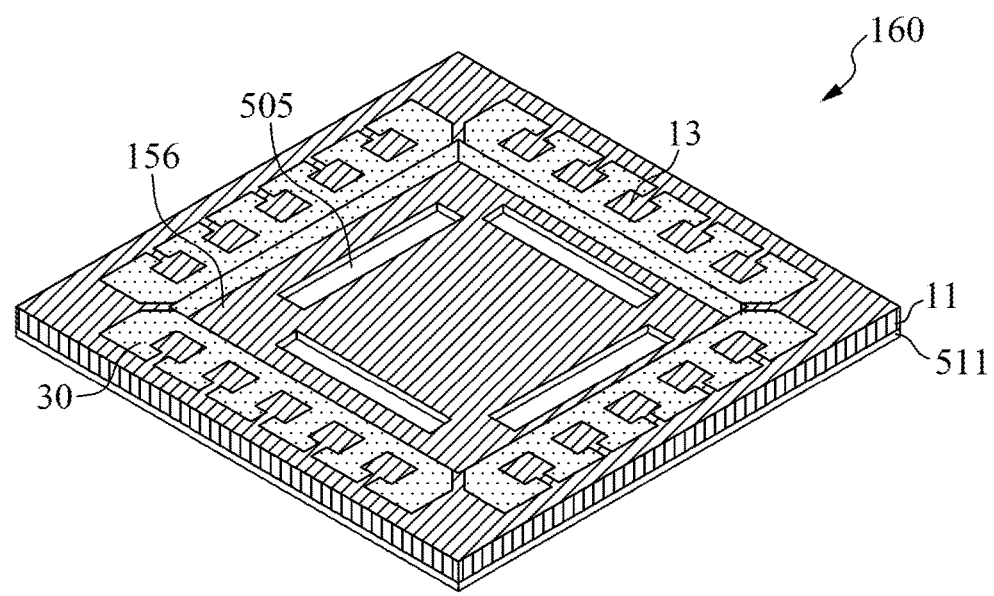

FIGS. 38 and 39 are cross-sectional and top perspective views, respectively, of yet another aspect of the untrimmed wiring substrate according to the first embodiment of the present invention. The untrimmed wiring substrate 160 is similar to that illustrated in FIG. 33, except that a plurality of apertures 505 is formed about the periphery of the cavity 305.

Figure 40:
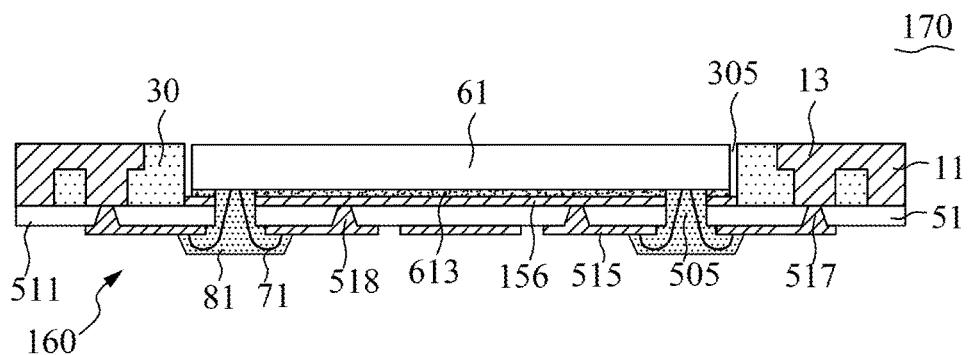
FIG. 40 is a cross-sectional view of a semiconductor assembly having a semiconductor device electrically connected to the wiring substrate of FIGS. 38 and 39 in accordance with the first embodiment of the present invention.

FIG. 40 is a cross-sectional view of a semiconductor assembly 170 with a semiconductor device 61 electrically coupled to the wiring substrate 160. The semiconductor device 61 is face-down disposed in the cavity 305 and attached on the metal paddle 156 through a thermally conductive material 613 and electrically coupled to the wiring layer 515 of the buildup circuitry 51 through bonding wires 71. Optionally, a molding compound 81 may be further provided to cover and encapsulate the bonding wires 71 from below and fill up the apertures 505.

Figure 41:
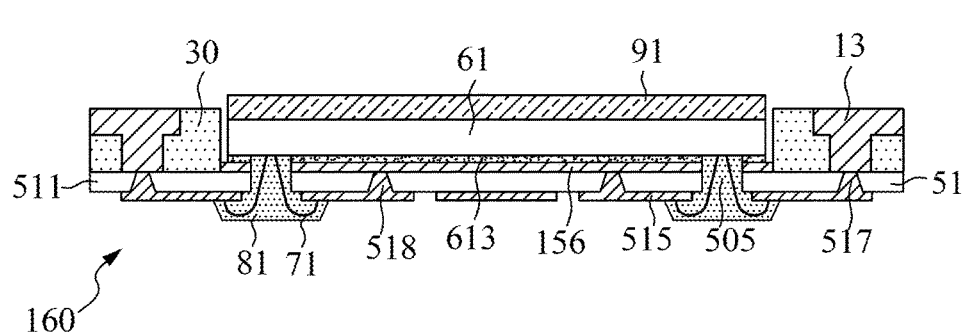
FIG. 41 is a cross-sectional view of the structure of FIG. 40 further provided with a heat spreader and subjected to a trimming process in accordance with the first embodiment of the present invention.

FIG. 41 is a cross-sectional view of the semiconductor assembly 170 after removal of the metal frame 11 and provided with a heat spreader 91. The heat spreader 91 is attached on the top surface of the semiconductor device 61 to enhance heat dissipation, followed by separating the metal frame 11 from the metal leads 13.

Figure 42:
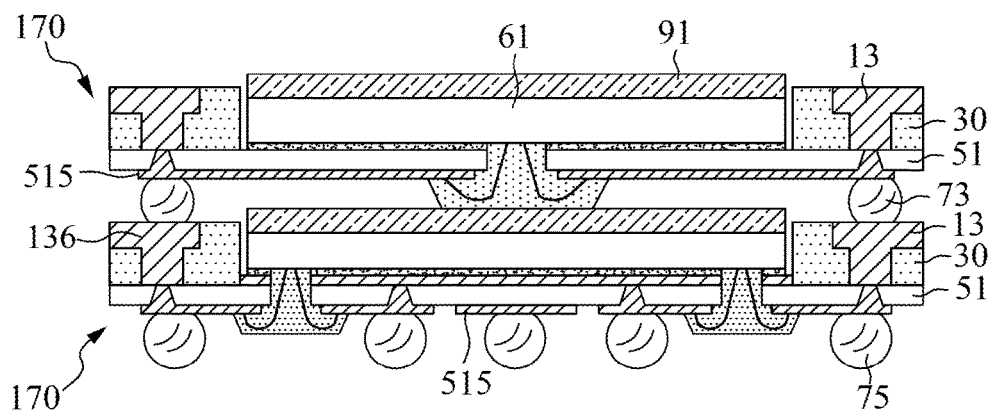
FIG. 42 is a cross-sectional view of a three-dimensional stacked semiconductor package having two semiconductor assemblies of FIG. 41 in accordance with the first embodiment of the present invention.

FIG. 42 is a cross-sectional view of a three-dimensional stacked semiconductor package having two semiconductor assemblies 170 of FIG. 41 electrically connected to each other by solder balls 73. The upper semiconductor assembly 170 is stacked on and electrically coupled to the lower semiconductor assembly 170 by the solder balls 73. Further, additional solder balls 75 are mounted on the wiring layer 515 of the buildup circuitry 51 of the lower semiconductor assembly 170.

Embodiment 2

FIGS. 43-49 are schematic views showing a method of making a wiring substrate in which the resin compound further covers the bottom of the cavity in accordance with the second embodiment of the present invention.

For purposes of brevity, any description in Embodiment 1 is incorporated herein insofar as the same is applicable, and the same description need not be repeated.

Figure 43:
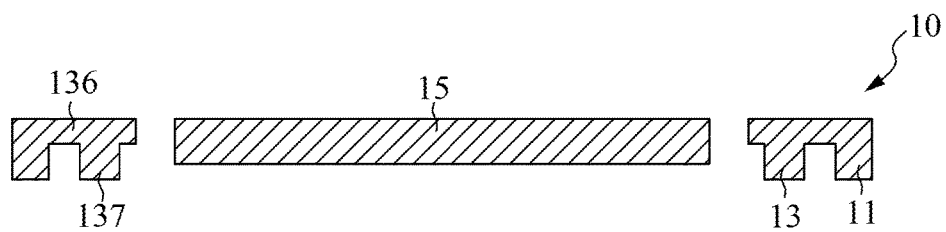
FIG. 43 is a cross-sectional view of a textured metal sheet in accordance with the second embodiment of the present invention.

FIG. 43 is a cross-sectional view of a textured metal sheet 10. The textured metal sheet 10 is similar to that illustrated in FIGS. 1-3, except that the metal slug 15 is thinner than the metal frame 11 and the metal leads 13.

Figure 44:
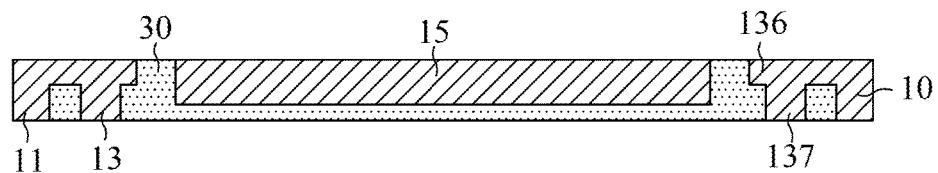
FIG. 44 is a cross-sectional view of the structure of FIG. 43 further provided with a resin compound in accordance with the second embodiment of the present invention.

FIG. 44 is a cross-sectional view of the structure provided with a resin compound 30. The resin compound 30 covers the lower surfaces of the horizontally elongated portions 136 and the bottom side of the metal slug 15 as well as sidewalls of the vertically projected portions 137 and sidewalls of the metal slug 15. By planarization, the resin compound 30 has a top surface substantially coplanar with the top sides of the metal frame 11, the metal leads 13 and the metal slug 15 and a bottom surface substantially coplanar with the bottom sides of the metal frame 11 and the metal leads 13.

Figure 45:
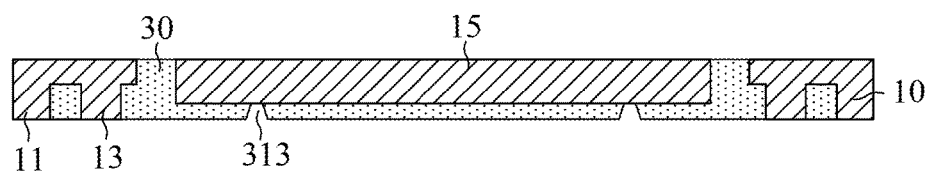
FIG. 45 is a cross-sectional view of the structure of FIG. 44 further provided with via openings in accordance with the second embodiment of the present invention.

FIG. 45 is a cross-sectional view of the structure provided with via openings 313. The via openings 313 extend through the resin compound 30 and are aligned with selected portions of the metal slug 15.

Figure 46:
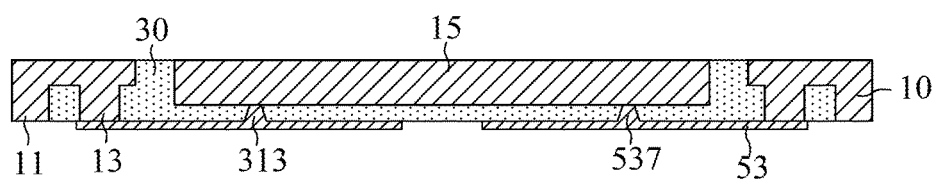
FIG. 46 is a cross-sectional view of the structure of FIG. 45 further provided with a re-distribution layer in accordance with the second embodiment of the present invention.

FIG. 46 is a cross-sectional view of the structure provided with a re-distribution layer 53 on the bottom surface of the resin compound 30. In this illustration, the re-distribution layer 53 is a patterned metal layer formed by metal pattern deposition. The re-distribution layer 53 laterally extends on the bottom surface of the resin compound 30 and electrically coupled to the bottom sides of the metal leads 13 and includes metallized vias 537 in contact with the bottom side of the metal slug 15.

Figure 47:
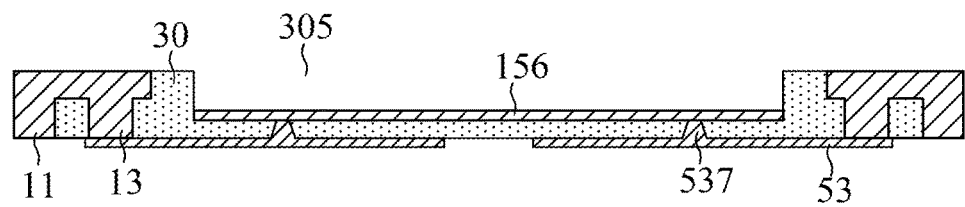
FIG. 47 is a cross-sectional view of the structure of FIG. 46 further formed with a cavity in accordance with the second embodiment of the present invention.

FIG. 47 is a cross-sectional view of the structure after selective removal of the metal slug 15. The metal slug 15 is selectively removed to form a cavity 305 and leave a remaining portion of the metal slug 15 as a metal paddle 156 located adjacent to the bottom of the cavity 305 and thermally conductible to the re-distribution layer 53 through the metallized vias 537.

Figure 48:
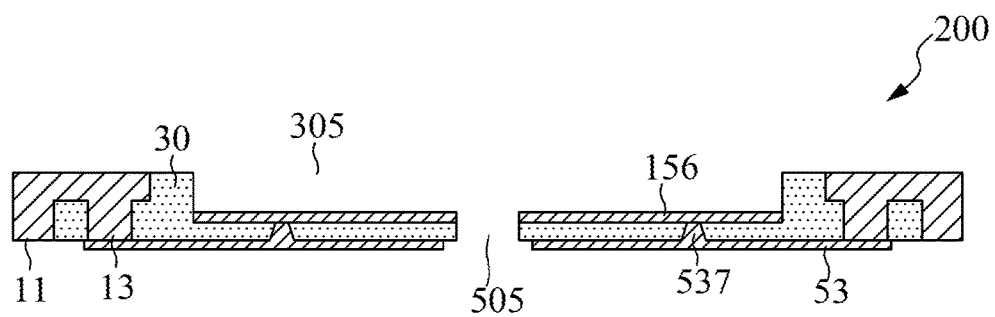
FIG. 48 is a cross-sectional view of the structure of FIG. 47 further formed with an aperture to finish the fabrication of an untrimmed wiring substrate in accordance with the second embodiment of the present invention.

FIG. 48 is a cross-sectional view of the structure provided with an aperture 505. The aperture 505 extends through the metal paddle 156 and the resin compound 30 in the vertical directions. At this stage, an untrimmed wiring substrate 200 is accomplished and includes the metal frame 11, the metal leads 13, the metal paddle 156, the resin compound 30 and the re-distribution 53.

Figure 49:
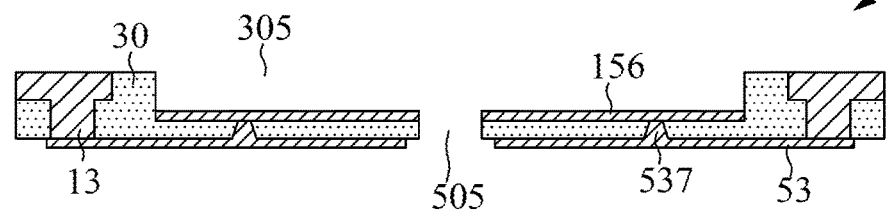
FIG. 49 is a cross-sectional view of the structure of FIG. 48 further subjected to a trimming process in accordance with the second embodiment of the present invention.

FIG. 49 is a cross-sectional view of the wiring substrate 200 after removal of the metal frame 11. By separating the metal frame 11, the connection between the metal leads 13 is broken.

Figure 50:
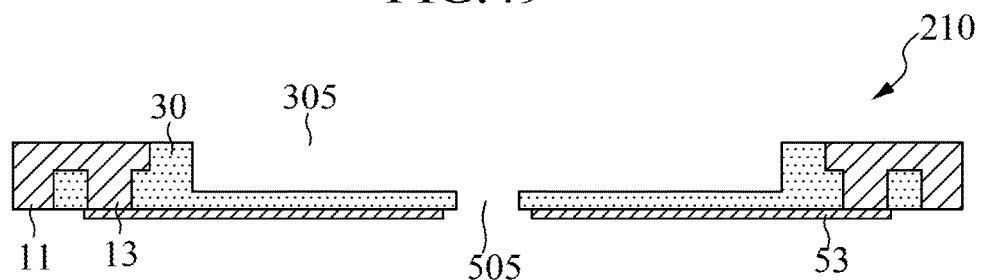
FIG. 50 is a cross-sectional view of another aspect of the untrimmed wiring substrate in accordance with the second embodiment of the present invention.

FIG. 50 is a cross-sectional view of another aspect of the untrimmed wiring substrate according to the second embodiment of the present invention. The untrimmed wiring substrate 210 is similar to that illustrated in FIG. 48, except that no metal paddle is retained at the bottom of the cavity 305 and no metallized vias are formed in the resin compound 30.

Embodiment 3

FIGS. 51-55 are schematic views showing a method of making a wiring substrate in which the resin compound further covers the bottom of the cavity and the bottom sides of the metal leads and the metal frame in accordance with the third embodiment of the present invention.

For purposes of brevity, any description in Embodiments above is incorporated herein insofar as the same is applicable, and the same description need not be repeated.

Figure 51:
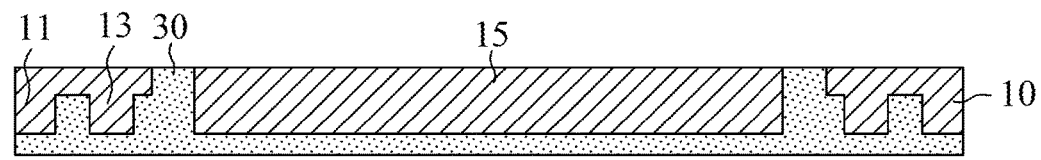
FIG. 51 is a cross-sectional view of a textured metal sheet bonded with a resin compound in accordance with the third embodiment of the present invention.

FIG. 51 is a cross-sectional view of the textured metal sheet 10 of FIG. 1 further provided with a resin compound 30. The resin compound 30 covers the bottom sides of the metal frame 11, the metal leads 13 and the metal slug 15 as well as sidewalls of the metal slug 15 and securely interlocks with the metal leads 13.

Figure 52:
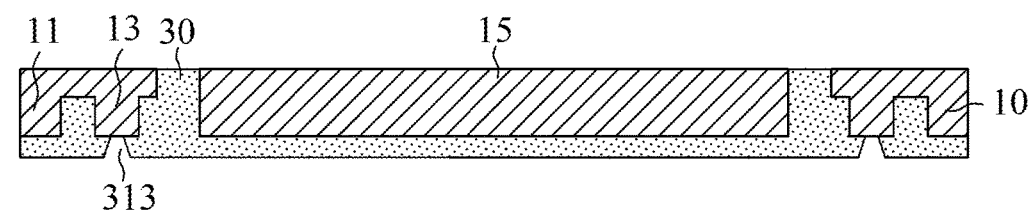
FIG. 52 is a cross-sectional view of the structure of FIG. 51 further provided with via openings in accordance with the third embodiment of the present invention.

FIG. 52 is a cross-sectional view of the structure provided with via openings 313. The via openings 313 extend through the resin compound 30 to expose selected portions of the metal leads 13 from below.

Figure 53:
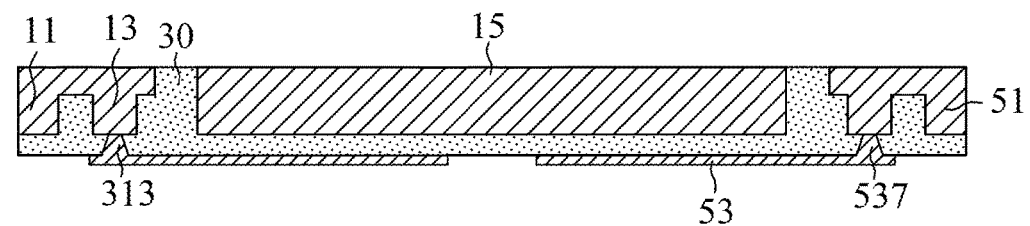
FIG. 53 is a cross-sectional view of the structure of FIG. 52 further provided with a re-distribution layer in accordance with the third embodiment of the present invention.

FIG. 53 is a cross-sectional view of the structure provided with a re-distribution layer 53 by metal pattern deposition. The re-distribution layer 53 laterally extends on the bottom surface of the resin compound 30 and is electrically coupled to the bottom sides of the metal leads 13 through metallized vias 537 in contact with the bottom sides of the metal leads 13.

Figure 54:
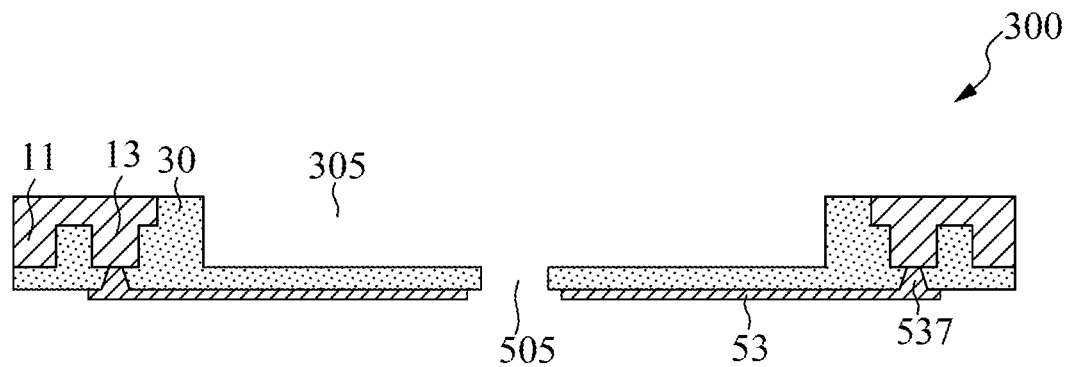
FIGS. 54 and 55 are cross-sectional and top perspective views, respectively, of the structure of FIG. 53 further formed with a cavity and an aperture to finish the fabrication of an umtrimmed wiring substrate in accordance with the third embodiment of the present invention.
Figure 55:
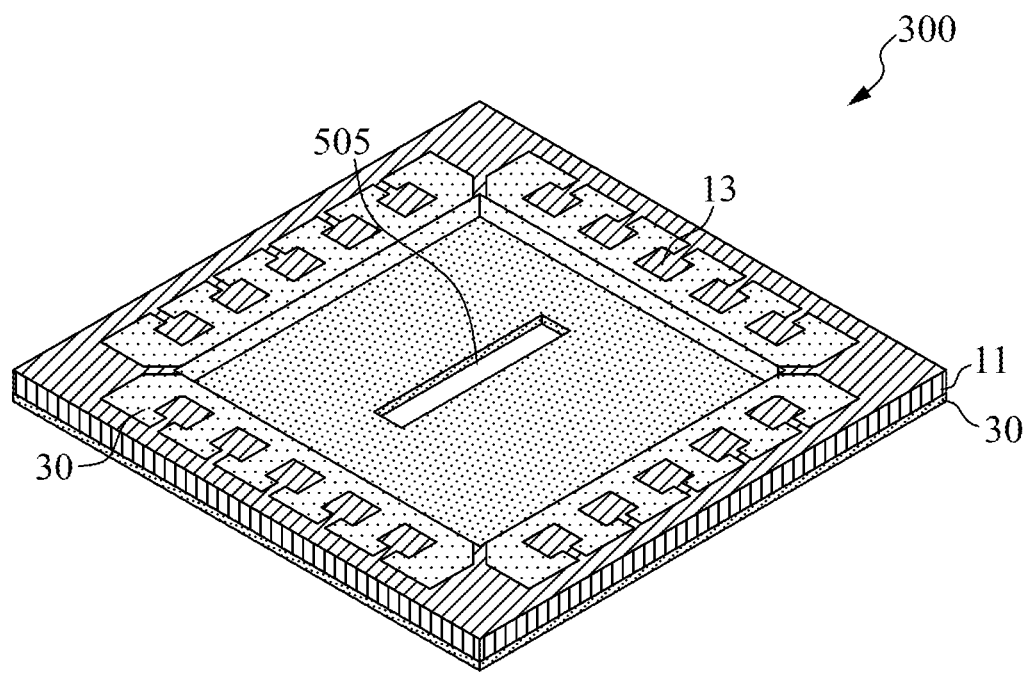

FIGS. 54 and 55 are cross-sectional and top perspective views, respectively, of the structure after removal of the metal slug 15 and provided with an aperture 505. The metal slug 15 is entirely removed to form a cavity 305 surrounded by the resin compound 30. After removal of the metal slug 15, the aperture 505 is formed through the resin compound 30 and aligned with the central area of the cavity 305. As a result, an untrimmed wiring substrate 300 is accomplished and includes the metal frame 11, the metal leads 13, the resin compound 30 and the re-distribution layer 53.

As illustrated in the aforementioned embodiments, a distinctive wiring substrate is configured to have a cavity surrounded by metal leads. In accordance with one preferred embodiment of the present invention, the wiring substrate of the present invention includes: a plurality of metal leads each having an inner end directed toward a predetermined area and an outer end situated farther away from the predetermined area than the inner end; a resin compound that fills in spaces between the metal leads and laterally extends beyond the inner ends of the metal leads and into the predetermined area to laterally surround a cavity at the predetermined area; a buildup circuitry that covers a bottom surface of the resin compound, a bottom of the cavity and bottom sides of the metal leads and is electrically connected to the metal leads through metallized vias; and an aperture that is aligned with the cavity and extends through the buildup circuitry. In accordance with another preferred embodiment of the present invention, the wiring substrate of the present invention includes: a plurality of metal leads each having an inner end directed toward a predetermined area and an outer end situated farther away from the predetermined area than the inner end; a resin compound that fills in spaces between the metal leads and laterally extends beyond the inner ends of the metal leads and into the predetermined area to laterally surround a cavity at the predetermined area and to cover a bottom of the cavity; a re-distribution layer that laterally extends on a bottom surface of the resin compound and is electrically connected to the metal leads; and an aperture that is aligned with the cavity and extends through the resin compound.

The metal leads can serve as horizontal and vertical signal transduction pathways or provide ground/power plane for power delivery and return. Each of the metal leads preferably is an integral one-piece lead and can be separated from a metal frame after provision of the resin compound. The metal leads separated from the metal frame have top and bottom sides and an exterior lateral surface perpendicular to the top and bottom sides and not covered by the resin compound. In a preferred embodiment, the metal leads have a thickness in a range from about 0.15 mm to about 1.0 mm and laterally extend at least to a perimeter coincident with peripheral edges of the resin compound. For secure bonds between the metal leads and the resin compound, the metal leads may have stepped peripheral edges interlocked with the resin compound. As a result, the resin compound also has a stepped cross-sectional profile where it contacts the metal leads so as to prevent the metal leads from being vertically forced apart from the resin compound and also to avoid micro-cracking at the interface along the vertical directions.

The resin compound can provide mechanical bonds between the metal leads, and may further cover the bottom sides of the metal leads or/and the bottom of the cavity. Alternatively, the resin compound may have a bottom surface substantially coplanar with the bottom sides of the metal leads and/or the bottom of the cavity. Preferably, the resin compound has a top surface substantially coplanar with the top sides of the metal leads. Further, the resin compound may have an elastic modulus larger than 1.0 GPa, a linear coefficient of thermal expansion in a range from about $5 \times 10^{-6}$ $K^{-1}$ to about $15 \times 10^{-6}$ $K^{-1}$. Additionally, for sufficient thermal conductivity and suitable viscosity, the resin compound may include thermally conductive fillers in a range of 10 to 90% by weight. For instance, the thermally conductive fillers may be made of aluminum nitride (AlN), aluminum oxide, silicon carbide (SiC), tungsten carbide, boron carbide, silica or the like and preferably has relatively high thermal conductivity, high electrical resistance, and a relatively low CTE. Accordingly, the resin compound would exhibit improved heat dissipation performance, electrical isolation performance and shows inhibition of delamination or cracking of the top re-distribution layer deposited thereon or interfaces due to low CTE. Additionally, the maximum particle size of the thermally conductive fillers may be 25 µm or less.

In a thermally enhanced case, the wiring substrate may further include a metal paddle located adjacent to the bottom of the cavity. The metal paddle can be made of the same material as the metal leads and have peripheral edges boned to the resin compound and a bottom surface substantially coplanar with that of the resin compound or covered by the resin compound. Specifically, the metal paddle can be provided by selective removal of the metal slug to leave a remaining portion of the metal slug as the metal paddle after provision of the resin compound. Accordingly, the cavity can have a metallic bottom as a thermal dissipation platform for a semiconductor device attached thereon, so that the heat generated by the semiconductor device can be conducted away through the metallic paddle layer.

The buildup circuitry can include at least one dielectric layer and at least one wiring layer. The dielectric layer and the wiring layer are serially formed in an alternate fashion and can be in repetition when needed. The dielectric layer covers the bottom surface of the resin compound, the bottom sides of the metal leads and the bottom of the cavity. The wiring layer extends through the dielectric layer to form metallized vias and extends laterally on the dielectric layer. Accordingly, the buildup circuitry can be electrically coupled to the metal leads through the metallized vias in the dielectric layer. In a preferred embodiment, the wiring layer of the buildup circuitry has selected portions laterally extending under the bottom of the cavity to provide electrical contacts about the aperture. Optionally, the buildup circuitry may be further connected to the metal paddle for heat dissipation and/or ground connection through additional metallized vias in the dielectric layer.

The re-distribution layer is spaced from the bottom of the cavity by the resin compound and in contact with the bottom sides of the metal leads. In a preferred embodiment, the re-distribution layer is a patterned metal layer deposited on the bottom surface of the resin compound, and has selected portions laterally extending under the bottom of the cavity to provide electrical contacts about the aperture. For the aspect of the bottom sides of the metal leads being covered by the resin compound, the re-distribution layer includes metallized vias in the resin compound for electrical connection with the metal leads. Optionally, the re-distribution layer may be further connected to the metal paddle for heat dissipation and/or ground connection through additional metallized vias in the resin compound.

The aperture is communicated with the cavity so that the semiconductor device disposed in the cavity can be electrically connected to the buildup circuitry or the re-distribution layer through bonding wires extending through the aperture. For DRAM connection, the aperture preferably is aligned with the central area of the cavity to expose terminal pads of the face-down DRAM accommodated in the cavity. In the thermally enhanced case, the aperture further extends through the metal paddle.

The present invention also provides a semiconductor assembly in which a semiconductor device is disposed in the cavity of the aforementioned wiring substrate and electrically connected to the wiring substrate through bonding wires. Specifically, the semiconductor device can be face-down disposed in the cavity and electrically connected to the buildup circuitry or the re-distribution layer by bonding wires attached to the wiring layer of the buildup circuitry or the re-distribution layer. In a thermally enhanced case, the semiconductor device is attached on the metal paddle. Optionally, a heat spreader may be further attached on the top surface of the semiconductor device to enhance heat dissipation.

The assembly can be a first-level or second-level single-chip or multi-chip device. For instance, the assembly can be a first-level package that contains a single chip or multiple chips. Alternatively, the assembly can be a second-level module that contains a single package or multiple packages, and each package can contain a single chip or multiple chips. The semiconductor device can be a packaged or unpackaged chip. For instance, the semiconductor device can be a bare chip, or a wafer level packaged die, etc. For instance, the semiconductor device may be a DRAM chip.

The term "cover" refers to incomplete or complete coverage in a vertical and/or lateral direction. For instance, in a preferred embodiment, the resin compound covers the bottom of the cavity regardless of whether another element (such as the metal paddle) is between the bottom of the cavity and the resin compound.

The phrases "attached to" and "attached on" include contact and non-contact with a single or multiple support element(s). For instance, in a preferred embodiment, the semiconductor device can be attached to the metal paddle regardless of whether the semiconductor device is separated from the metal paddle by the thermally conductive material.

The phrases "electrical connection", "electrically connected" and "electrically coupled" refer to direct and indirect electrical connection. For instance, in a preferred embodiment, the semiconductor device can be electrically connected to the re-distribution layer by the bonding wires but does not contact the re-distribution layer.

The wiring substrate according to the present invention has numerous advantages. The metal paddle establishes a heat dissipation pathway for spreading out the heat generated by the semiconductor device. The resin compound provides robust mechanical bonds between the metal leads, and offers a dielectric platform for the re-distribution layer or the build-up circuitry deposited thereon. The metal leads provide primary horizontal and vertical routing, whereas the re-distribution layer or the build-up circuitry offers further routing under the bottom of the cavity. The wiring substrate made by this method is reliable, inexpensive and well-suited for high volume manufacture.

The manufacturing process is highly versatile and permits a wide variety of mature electrical and mechanical connection technologies to be used in a unique and improved manner. The manufacturing process can also be performed without expensive tooling. As a result, the manufacturing process significantly enhances throughput, yield, performance and cost effectiveness compared to conventional techniques.

The embodiments described herein are exemplary and may simplify or omit elements or steps well-known to those skilled in the art to prevent obscuring the present invention. Likewise, the drawings may omit duplicative or unnecessary elements and reference labels to improve clarity.

What is claimed is:

1. A method of making a wiring substrate, the method comprising steps of:

providing a metal frame, a metal slug and a plurality of metal leads, wherein the metal slug is located within the metal frame, and the metal leads are integrally connected to the metal frame and each has an inner end directed inwardly away from the metal frame and directed toward the metal slug;

providing a resin compound that fills in remaining spaces within the metal frame, wherein the resin compound has a bottom surface substantially coplanar with a bottom side of the metal slug;

forming a buildup circuitry that is electrically connected to bottom sides of the metal leads, wherein the buildup circuitry includes a dielectric layer and a wiring layer, the dielectric layer covers the bottom surface of the resin compound and the bottom sides of the metal slug and the metal leads, and the wiring layer extends laterally on the dielectric layer and is electrically connected to the metal leads through metallized vias in the dielectric layer;

removing at least one selected portion of the metal slug to form a cavity, wherein the cavity has an entrance at a top surface of the resin compound; and forming an aperture that is aligned with the cavity and extends through the dielectric layer of the buildup circuitry.

2. The method of claim 1, further comprising a step of separating the metal frame from the metal leads.

3. The method of claim 1, wherein the step of removing at least one selected portion of the metal slug includes leaving a remaining portion of the metal slug as a metal paddle located adjacent to a bottom of the cavity, and the aperture further extends through the metal paddle.

4. The method of claim 3, wherein the wiring layer of the buildup circuitry is further connected to the metal paddle through additional metallized vias in the dielectric layer.

5. The method of claim 1, wherein the wiring layer of the buildup circuitry has selected portions laterally extending under a bottom of the cavity.

6. A method of making a wiring substrate, the method comprising steps of:

providing a metal frame, a metal slug and a plurality of metal leads, wherein the metal slug is located within the metal frame, and the metal leads are integrally connected to the metal frame and each has an inner end directed inwardly away from the metal frame and directed toward the metal slug;

providing a resin compound that fills in remaining spaces within the metal frame and covers a bottom side of the metal slug;

forming a re-distribution layer that extends laterally on a bottom surface of the resin compound and is electrically connected to bottom sides of the metal leads;

removing at least one selected portion of the metal slug to form a cavity, wherein the cavity has an entrance at a top surface of the resin compound; and forming an aperture that is aligned with the cavity and extends through the resin compound.

7. The method of claim 6, further comprising a step of separating the metal frame from the metal leads.

8. The method of claim 6, wherein the step of removing at least one selected portion of the metal slug includes leaving a remaining portion of the metal slug as a metal paddle located adjacent to a bottom of the cavity, and the aperture further extends through the metal paddle.

9. The method of claim 8, wherein the re-distribution layer is further connected to the metal paddle through metallized vias in the resin compound.

10. The method of claim 6, wherein the metal slug is thinner than the metal leads, and the bottom surface of the resin compound is substantially coplanar with the bottom sides of the metal leads.

11. The method of claim 6, wherein the resin compound further covers the bottom sides of the metal leads, and the re-distribution layer is electrically connected to the metal leads through metallized vias in the resin compound.

12. The method of claim 6, wherein the re-distribution layer has selected portions laterally extending under a bottom of the cavity.

13. A method of making a stackable semiconductor assembly, the method comprising steps of:

providing a wiring substrate by the method of claim 1; and disposing a semiconductor device in the cavity of the wiring substrate and electrically coupling the semiconductor device to the wiring substrate through bonding wires, wherein the bonding wires extend through the aperture and provide electrical connection between the semiconductor device and the wiring layer.

14. The method of claim 13, wherein the step of removing at least one selected portion of the metal slug includes leaving a remaining portion of the metal slug as a metal paddle located adjacent to a bottom of the cavity, and the semiconductor device is attached on the metal paddle.

15. The method of claim 13, further comprising a step of attaching a heat spreader on a top surface of the semiconductor device.

16. A method of making a stackable semiconductor assembly, the method comprising steps of:

providing a wiring substrate by the method of claim 6; and disposing a semiconductor device in the cavity of the wiring substrate and electrically coupling the semiconductor device to the wiring substrate through bonding wires, wherein the bonding wires extend through the aperture and provide electrical connection between the semiconductor device and the re-distribution layer.

17. The method of claim 16, wherein the step of removing at least one selected portion of the metal slug includes leaving a remaining portion of the metal slug as a metal paddle located adjacent to a bottom of the cavity, and the semiconductor device is attached on the metal paddle.

18. The method of claim 16, further comprising a step of attaching a heat spreader on a top surface of the semiconductor device.

* * * * *